(12) United States Patent
Meers et al.

(10) Patent No.: US 8,326,784 B2
(45) Date of Patent: Dec. 4, 2012

(54) DEVICE FOR AND A METHOD OF DESIGNING A SENSOR ARRANGEMENT FOR A SAFE AUTOMATED SYSTEM, AN AUTOMATED SYSTEM, A PROGRAM ELEMENT AND A COMPUTER-READABLE MEDIUM

(75) Inventors: Francois Meers, Brussels (BE); Marc Massar, New York, NY (US); Olivier Bilenne, Neuville-en-Condroz (BE); Emmanuel Druet, Namur (BE)

(73) Assignee: Multitel ASBL, Mons (BE)

( * ) Notice: Subject to any disclaimer, the term of this patent is extended or adjusted under 35 U.S.C. 154(b) by 1056 days.

(21) Appl. No.: 12/094,518

(22) PCT Filed: Nov. 22, 2006

(86) PCT No.: PCT/EP2006/011195
§ 371 (c)(1),
(2), (4) Date: Oct. 10, 2008

(87) PCT Pub. No.: WO2007/059942
PCT Pub. Date: May 31, 2007

(65) Prior Publication Data
US 2009/0222776 A1 Sep. 3, 2009

Related U.S. Application Data

(60) Provisional application No. 60/738,921, filed on Nov. 22, 2005.

(30) Foreign Application Priority Data

Apr. 21, 2006 (EP) ..................................... 06008296

(51) Int. Cl.
*G06F 17/00* (2006.01)
*G06F 15/00* (2006.01)
*G06F 15/18* (2006.01)
*G06N 5/00* (2006.01)

(52) U.S. Cl. ............................................. 706/45; 706/62
(58) Field of Classification Search .................. 706/45, 706/62
See application file for complete search history.

(56) References Cited

U.S. PATENT DOCUMENTS 5,202,829 A * 4/1993 Geier ............................ 701/215
(Continued)

FOREIGN PATENT DOCUMENTS

DE 19722907 A1 12/1998
(Continued)

OTHER PUBLICATIONS

D.E. Penny, "The automatic management of multi-sensor systems", Proc. Int'l. Conf. on Information Fusion, pp. 748-755, 1998.*

(Continued)

*Primary Examiner* — Kakali Chaki
*Assistant Examiner* — Vincent Gonzales
(74) *Attorney, Agent, or Firm* — Robert A. Blaha; Smith Risley Tempel Santos LLC

(57) ABSTRACT

A device for designing a sensor arrangement for an automated system, the device comprising a first input unit for receiving a specification of a plurality of sensor measurements to be carried out by the sensor arrangement, a second input unit for receiving a specification of a confidence region together with an associated confidence level for each of the specified sensor measurements, a third input unit for receiving a specification of a target confidence level for the automated system, and a configuration unit for configuring the plurality of sensor measurements and for configuring the combination of the sensor measurements in a manner to guarantee the target confidence level for the automated system.

18 Claims, 4 Drawing Sheets

U.S. PATENT DOCUMENTS

| | | | |
|---|---|---|---|
| 5,626,140 | A | 5/1997 | Feldman et al. |
| 5,893,043 | A | 4/1999 | Moehlenbrink et al. |
| 6,445,728 | B1 | 9/2002 | Byun |
| 2003/0018618 | A1 | 1/2003 | Bestgen et al. |
| 2004/0172401 | A1 | 9/2004 | Peace |

FOREIGN PATENT DOCUMENTS

| | | | |
|---|---|---|---|
| DE | 10338234 | A1 | 9/2004 |
| DE | WO2005/009517 | A1 | 2/2005 |
| EP | 0612039 | A2 | 8/1994 |
| EP | 0825418 | A2 | 2/1998 |
| EP | 0881136 | A2 | 12/1998 |
| EP | 1462761 | A1 | 9/2004 |
| EP | 1299746 | B1 | 12/2004 |
| WO | WO01/42621 | A1 | 6/2001 |
| WO | WO01/97059 | A2 | 12/2001 |
| WO | WO02/03094 | A2 | 1/2002 |

OTHER PUBLICATIONS

International Electrotechnical Commission (IEC), International Standard IEC61508, Functional safety of electrical / electronic / programmable electronic safety related systems, May, 2004, Geneva, Switzerland.

D. Sornette and K. Ide, The Kalman-Levy filter, Physica D, 2001, 151:142-174.

M.S. Arulampalam, S. Maskell, N. Gordon, and T. Clapp, A Tutorial on Particle Filters for Online Nonlinear/ Non-Gaussian Bayesian Tracking, IEEE Transactions on Signal Processing, Feb. 2002, 50(2):174-188.

R.C. Williamson, Probabilistic Arithmetic, Ph. D. thesis, 1989, University of Queensland.

A. Neumaier, Clouds, Fuzzy Sets and Probability Intervals, Mar. 2003, 10:249-272, Reliable Computing.

K. Marzullo, Tolerating Failures of Continuous- Valued Sensors, Technical Report TR 90-156, 1990, Cornell University.

D. J. Berleant, S. Ferson, V. Kreinovich and W.A. Lodwick, Combining Interval and Probabilistic Uncertainty : Foundations, Algorithms, Challenges—An Overview, 4th International Symposium on Imprecise Probabilities and Their Applications, 2005, Pittsburgh, Pennsylvania.

A. Simsky, F. Wilms and J.P. Franckart, GNSS based failsafe train positioning system for low-density traffic lines based on one-dimensional positioning algorithm, 2004, ESA NAVITEC Workshop.

CENELEC Standard EN50126, Railway Applications—The Specification and Demonstration of Reliability, Availability, Maintainability and Safety (RAMS), 1999.

Yunmin Zhu and Baohua Li, Optimal Interval Estimation Fusion Based on Sensor Interval Estimates With Confidence Degrees, Automatica, 42:101-108, 2006.

U. Schmid and K. Schossmaier, How to Reconcile Fault-Tolerant Interval Intersection With the Lipschitz Condition, Distributed Computing, 14(2):101-111, 2001.

S. Ferson, J. Hajagos, D. Berleant, J. Zhang, W.T. Tucker, L. Ginzburg and W. Oberkampf, Dependence in Dempster-Schafer Theory and Probability Bounds Analysis, Technical Report SAND2004-3072, Sandia National Laboratory, 2004.

M. Jaeger, Automatic Derivation of Probabilistic Inference Rules, Int. J. of Approximate Reasoning, 28(1):1-22, 2001.

T. Hailperin, Probability Logic, Notre Dame Journal of Formal Logic, 25(3): 198-212, 1984.

Yaakov Bar-Shalom et al., Estimation With Applications to Tracking and Navigation—Theory Algorithms and Software, 2001, pp. 1-294, John Wiley & Sons, New York, New York, U.S.A.

Luc Jaulin et al., Applied Interval Analysis—With Examples in Parameter and State Estimation, Robust Control and Robotics, 2001, pp. 1-199, Springer-Verlag, London, Great Britain.

Ramon E. Moore, Interval Analysis, 1966, pp. 1-82, Prentice Hall, Inc., Englewood Cliffs, N.J., U.S.A.

Theodore Hailperin, Boole's Logic and Probability, Studies in Logic and the Foundations of Mathematics, vol. 85, 1986, pp. 1-222, Elsevier Science Publishers B.V., Amsterdam, The Netherlands.

* cited by examiner

DEVICE FOR AND A METHOD OF DESIGNING A SENSOR ARRANGEMENT FOR A SAFE AUTOMATED SYSTEM, AN AUTOMATED SYSTEM, A PROGRAM ELEMENT AND A COMPUTER-READABLE MEDIUM

This application claims the benefit of the filing date of U.S. Provisional Patent Application No. 60/738,921 filed Nov. 22, 2005, as well as of European Patent Application No. 06 008 296.3 filed Apr. 21, 2006 the disclosure of which is hereby incorporated herein by reference.

The invention relates to a device for designing a sensor arrangement for an automated system.

The invention further relates to a method of designing a sensor arrangement for an automated system.

Beyond this, the invention relates to an automated system.

Moreover, the invention relates to a program element.

Furthermore, the invention relates to a computer-readable medium.

The demand for safe and reliable systems is increasingly present in today's society, which advances towards more and more automated systems. When those systems deal with safety of life, the safety of the applications has to be proven. Obvious examples of such systems are air and rail transportation: providers of airplanes or trains equipped with automatic equipment for landing and braking have to prove to their clients (airplane companies or public transport operators) that their system meets specifications of safety, often expressed in standards such as the EN50126 CENELEC standard for European railways [1]. These norms typically specify maximum failure probabilities or failure rates, which are extremely low. As an extreme case, the SIL4 safety integrity level defined in the IEC 61508 standard for safety critical systems [2] requires a failure rate less then $10^{-9}$ an hour.

Next, references for state estimation will be explained.

One technique for state estimation is the Kalman Filter, which is proved to be optimal for normal and white noises. This filter has been extended in a number of ways [3]. Non-linear problems may be dealt with via the Extended Kalman Filter. Multiple dynamic models can be tracked with the Interacting Multiple Model (IMM) algorithm, similar in principle to a Gaussian mixture [3]. In presence of heavy-tailed noise distributions, the Kalman-Lévy filtering provides proper solutions [4]. More sophisticated distributions (both for noises and estimated variables) can be approximated with the theory of particle filtering, a non-parametric representation method that proves useful for nonlinear and non Gaussian problems [5]. All methods of this list have the property of using a full description of the probability density function ("pdf") of the various involved variables, which is a major impediment for their use in high integrity applications. A state estimation theory using intervals is the theory of bounded error estimation [6]. It is based on interval arithmetic. This theory, designed to prove the safety of the estimation process, can be seen as a "100%-confidence intervals" method, where it is assumed that variables, without any doubt, lie in appropriate boxes. However, proving that sensors provide "100% confidence intervals" is impossible in practice.

Next, references related to interval-based theories will be explained.

Interval computations, on which the bounded error theory relies, have been used in topics such as computer error propagation, global optimization and robust control, among others [7]. There are scientific works using confidence intervals models for various purposes. A reference work in the field is the thesis of Robert Williamson [8], which presents an overview of the work available at the time. These theories are gaining interest currently, as recent publications by Neumaier [9] and by Zhu and Li [10] show. Reference is also made to works done by Marzullo [11] and pushed further by Schmid and Schlossmaier [12], which rather deal with detection of faulty sensors than with confidence intervals. Recent works by Kreynovich and coworkers [13], already active in uncertainty modeling and probability boxes [14], take the direction of interval computations.

Next, further conventional systems will be explained.

Proving safety of estimation had already been used in industry sectors where safety and reliability are at the core of the business, namely in the field of railways, for speed and position estimation, both in literature [15] and in patents [16,17].

Further background art is disclosed in [18] to [28].

It is an object of the invention to allow a reliable operation of an automated system.

In order to achieve the object defined above, a device for and a method of designing a sensor arrangement for an automated system, an automated system, a program element and a computer-readable medium according to the independent claims are provided.

According to an exemplary embodiment of the invention, a device for designing a sensor arrangement for an automated system is provided, the device comprising a first input unit for receiving a specification of a plurality of sensor measurements to be carried out by the sensor arrangement, a second input unit for receiving a specification of a confidence region (for instance an interval for a physical value) together with an associated confidence level (for instance a confidence that the true value be in the interval) for each of the specified sensor measurements, a third input unit for receiving a specification of a target confidence level for the automated system, and a configuration unit for configuring the plurality of sensor measurements and for configuring the combination of the sensor measurements in a manner to guarantee the target confidence level for the automated system.

It is possible that the second input unit receives the specification of the confidence region together with a lower bound on the confidence level associated to the confidence region. A measurement or an estimated variable may be expressed as both a confidence level and a confidence region. The "confidence level" may denote the confidence for each measurement or estimation. The "confidence region" may denote the plausible physical values for the variables, either connected or not.

According to a further exemplary embodiment of the invention, a method of designing a sensor arrangement of an automated system is provided, the method comprising receiving a specification of a plurality of sensor measurements to be carried out by the sensor arrangement, receiving a specification of a confidence region together with an associated confidence level for each of the specified sensor measurements, receiving a specification of a target confidence level for the automated system, and configuring the plurality of sensor measurements and for configuring the combination of the sensor measurements in a manner to guarantee the target confidence level for the automated system.

According to yet another exemplary embodiment of the invention, an automated system is provided comprising a sensor arrangement designed using a device having the above-mentioned features and/or a method having the above-mentioned features.

According to still another exemplary embodiment of the invention, a program element is provided, which, when being executed by a processor, is adapted to control or carry out a method having the above-mentioned features.

According to yet another exemplary embodiment of the invention, a computer-readable medium (e.g. a CD, a DVD, a USB stick, a floppy disk or a hard disk) is provided, in which a computer program is stored which, when being executed by a processor, is adapted to control or carry out a method having the above-mentioned features.

The system according to embodiments of the invention can be realized by a computer program, that is by software, or by using one or more special electronic optimization circuits, that is in hardware (for instance including one or more microprocessors), or in hybrid form, that is by means of software components and hardware components.

According to an exemplary embodiment of the invention, a scheme is provided which allows to construct a sensor arrangement for an automated system (with a proof of safety/confidence) which sensor arrangement may be used to measure sensed parameters during operating the automated system, as a basis for monitoring and/or controlling and/or regulating the automated system in a secure manner. On the basis of the estimated sensed parameters, the automated system may be controlled.

Embodiments of the invention relate to a scheme for developing a virtual sensor arrangement that may be adjusted to predefined requirements and which may be designed to be in accordance with qualitative or quantitative security demands. Such a theoretically developed sensor system may then be transferred into a physical real-world sensor array to be mounted in functional coupling with the automated system.

For instance, the sensor arrangement may be adapted for measuring parameters like position, velocity, acceleration of a train, and the curvature and slope of the railway track. Based on these sensed parameters, the train system may then be controlled automatically with respect to velocity, direction selection, railway switch steering, etc.

Conventionally, a sensor may be modeled using a probability density function ("pdf"), for instance may be modeled to have some kind of Gaussian error distribution, wherein, when the real value of the sensed parameter to be detected equals to the maximum value of the Gaussian distribution, the actually obtained sensor result is described by this Gaussian distribution. In contrast to this, embodiments of the invention use another sensor model. In the context of this sensor model, it is assumed that an acceptable sensor result, that is to say a value sufficiently close to the real value, is obtained with a probability that may be denoted as the confidence level for this sensor (for instance $1-10^{-4}$). However, there is also a possibility which is one minus this confidence level (for instance $10^{-4}$), that is the output sensor value is so far away from the real value (namely differs from the real value by more than a value defined by the confidence region, for instance more than $3\sigma$) that a failure of the sensor measurement due to the incorrectly measured sensed parameter occurs. The confidence range (interval in a one-dimensional case) and the confidence level are closely linked to one another, so that a modification of the confidence range would influence the confidence level, and vice versa. When a plurality of sensors or one sensor carrying out the plurality of measurements, is/are used to control the automated system, then each sensor measurement has such an assigned combination of confidence region and lower bound on confidence level.

It should be distinguished between the difference between the measurements on one side and the estimates on the other side. Faulty measurements may inevitably occur. But in well-designed systems these faults may be tolerated and do not put the overall safety in danger. This is also related to the difference between the confidence levels for single measurements (usually not above $1-10^{-4}$) and the confidence level to be proved for the overall system (much higher, say $1-10^{-12}$ for instance). Even if they follow the same model (the combination of a confidence region with a confidence level), a conceptual distinction should be made between the sensed parameters (also called the measurements, the observations) and the estimated variables (which can be denoted as computed, determined).

A model according to an exemplary embodiment may be limited to the following assumptions:

Each source of information (or measurement) is provided as a single value (e.g.; 10 m/s)

Given knowledge about the sensor and its statistical error distribution, it is associated to this value both:

A computed confidence interval (also called region) (e.g.: [9;11] m/s) (which is not required to be symmetric with respect to the measured value)

A lower bound on the confidence level (e.g.: 0.9999)

A fundamental equation used then is only: Probability (true value $\in$ computed interval)$\geqq$confidence lower bound The "interval measurement" is called valid if the (unknown) true value is in the interval The "interval measurement" is called invalid (or faulty) if the (unknown) true value is not in the interval If required (in case of multidimensional problems), from these intervals "confidence regions" are computed for the (unknown) variables that shall be estimated (e.g. GPS application, see FIG. 8). Regions are the multidimensional counterparts of the one-dimensional interval.

The regions computed from the various information sources (measurements) are then combined in a certain way, providing an estimation of the unknown variables, expressed as a confidence region; it may be also theoretically computed a lower bound on the confidence associated to that region The model used for these estimated variables is similar to the model used for the measurements, that is: Probability (true values of unknown variables $\in$ computed region) $\geqq$theoretically computed confidence lower bound.

This sensor model has some sort of "digital" character: it assumes that a sensor provides an acceptable (correct) sensed parameter (expressed as a region or an interval) with a certain probability, and that the sensor provides an unacceptable (incorrect) sensed parameter with a probability of one minus the certain probability.

This simplification turns out to be a highly reliable and easily manageable way of describing a sensor without involving a high amount of computational burden and unnecessary assumptions about the error distribution. The probability may be derived based on a known or measurable sensor characteristics and based on a deviation of the actual measurement result from the correct measurement result which is less than a definable value, for instance less than $3.5\sigma$ or less than any other integer or non-integer multiple larger than or equal to or smaller than one ($\sigma$ being the standard deviation of the measurement).

By combining the plurality of sensor measurements in an advantageous manner, a correct control of the automated system may even be ensured when, for instance, one of the sensors fails, and the other sensors provide or deliver a correct result. The probability that the automated system is controlled in a correct manner, that is to say a non-failure probability for the entire automated system, may be described by the value of the target confidence level. For instance, when the target confidence level for the train is $1-10^{-12}$, that is to say that in $10^{12}$ estimations of the positions of the train, only one failure event is happening. The failure probabilities for each of the sensors or sensor measurement may be much larger, for instance $10^{-4}$. Care should be taken about the difference between failure probabilities (that shall be proved) and the failure rates. Actually, SIL4 specifies failure rates (expressed as upper bounds on failure per hour).

When each of the sensors yields a result with a reliability described by a certain error interval associated to a certain confidence level, the combination of multiple sensors and therefore error intervals may allow for a statement of a general safety with respect to failures of the entire system.

Exemplary embodiments of the invention may use the specified confidence levels for the different sensor measurements (which may also be determined by the design device before the configuring) and may try to combine the different sensor configurations so that the combination of the plurality of sensor measurements allow to meet the target confidence level.

Therefore, for a given target confidence level and the definition of multiple sensor measurements with corresponding confidence regions and confidence levels, the sensor arrangement may be designed so that the specified target confidence level can be proved to be at least met in the statistical average.

Thus, the readings of different sensors may be combined so that safety may be ensured for a particular application. For instance, the position or the speed of a train may be measured Then, the train as an automatically controllable system may be automatically controlled in a manner to adjust speed, etc., of the train based on the sensor information, for instance when the train goes from a low-speed track to a high-speed track. According to an exemplary embodiment, satellite positioning methods, for instance GPS, may be implemented.

For example, four sensors may be provided each measuring the velocity of the train. The physical measuring principles of the different sensors may be same (for instance four GPS sensor measurements: usually with GPS, there is a single sensor (called receiver), which performs several measurements, usually related to the visible satellites. In classical GPS use, for each visible satellite the receiver performs a measurement of the pseudo-range between itself and the satellite) or may differ (for instance a wheel counter sensor, a radar sensor, an accelerometer sensor, and a GPS sensor). A dependency or independency of the individual sensor measurements may be (and in some cases must be) taken into account when combining the various sensor measurements. For each of the sensors, a confidence level may be assumed or determined. The confidence level may be the same for all sensor measurements, or may differ. Then, a certain interval is defined around a detected or sensed parameter, and the combination of these intervals can allow to finally guarantee that, in the statistical average, the specified target confidence level of the entire system is met.

The sensors may provide some redundancy, for instance when the physical principle of the measurements is the same. The sensor measurements may, alternatively, be independent from one another, so that it may be ruled out that two different sensors fail due to the same physical reason. Making benefit from such a redundancy and/or independency of sensors, the reliability of the entire system may be improved, that is to say the reliability of the entire system may be better than the confidence level for an individual sensor. However, when a dependency is present, it is recommendable to take into account such a dependency to obtain a reliable result or safety. Physical laws may impose the dependence of the information sources, and then it may be required to take them into account, because they put the safety in danger (in such an exemplary scenario it may be prohibited to assume they are independent if they are dependent).

For instance, a hardware configuration of a sensor arrangement developed in accordance with an embodiment of the invention may implement the plurality of sensors, for instance three sensors, in a train. An electronic circuit may be foreseen to provide the measurement results of the sensors. The sensor measurements may be transmitted to a control system, which uses the sensor results in order to control the automated system. Therefore, a system may be provided which may be brought in accordance with given security standards.

One aspect of the invention is that the sensor model is considered to be such that the sensor does not follow any specified error distribution function (for instance a Gaussian function or a Lorentzian function). In contrast to this, a simple probability (that is to say one number) is defined, as the probability that the measurement is invalid, in the sense that the true value of the sensed parameters is not in the computed confidence region. This involves a significant simplification of a sensor model that is appropriate for safe systems and allows to derive meaningful results with low computational burden. A plurality of intervals (more generally regions) of errors of individual sensors may be combined to derive a common safety interval with a larger reliability. The term "interval" is restricted to a one-dimensional case, and the term "region" is the more-dimensional equivalent thereof. Thus, "interval" is relevant for the measurements (usually a single value), whereas "region" may relate to the estimated variables (either dynamic or static).

According to an exemplary embodiment, "state estimation" in any automated system may be provided (for instance in a nuclear plant or a chemical factory).

When a train moves along a track, different sensors (for instance a plurality of GPS sensors) each determine the position of the train. Thus, the actual position of the train may be computed based on multiple measurements performed at the same time or at different points of time. The several measurements that can be used can particularly come from the same sensor at several moments or from various sensors at the same moment.

According to embodiments of the invention, it is possible to provide, in the automatic system, only a single sensor with which a plurality of sensor measurements are carried out. It is also possible to use a plurality of sensors, each carrying out one measurement. More generally, at least one sensor may be provided, wherein at least one of the at least one sensor carries out at least two measurements. It is also possible to provide at least two sensors, wherein each of the at least two sensors carries out at least one measurement.

According to an embodiment of the invention, the target level of confidence of the entire system is kept constant, and the sensor configuration is determined in such a manner that this reliability level is achieved. For this purpose, the device for designing a sensor arrangement according to an exemplary embodiment of the invention may determine how many sensors are necessary and how their sensor outputs should be combined to reach the predetermined level of confidence. It is possible to combine different sensors having different confidence levels.

The criteria for designing the sensor arrangement (in addition to the target confidence level) may include to specify which sensors (that is to say which types of sensors) are implemented, how many of such sensors are implemented, what the confidence levels are for each sensor, (if available) what accuracy is associated to each sensor, what measuring frequency is available, and whether there is a dependency or independency of the measurement principles of the sensors.

Furthermore, the confidence level (or integrity value) may be specified for each individual sensor, and the desired confidence level of the entire system may be specified. Then, with this information, the device may determine automatically how to construct the sensor system. This may include adjusting working points of the individual sensors, additionally to a manner as to how to combine sensor results (using algorithms like "second best", "union", "combining two or more sensors", "taking intersection").

By taking such measures, it may be proved that the automatic system, which may be mounted physically based on a virtually defined sensor arrangement and automatic system, may ensure to reach the desired confidence level.

Providing different sensor types, it may be also possible to measure/regulate multi-parameters.

State estimation with confidence intervals proof may be enabled.

It is also possible, according to exemplary embodiments of the invention, to combine subgroups of the sensors and evaluate the sensor results of these subgroups in combination.

For instance, an anti-collision system may be provided (for instance to avoid train collisions) or to avoid that a temperature of an automated system exceeds a dangerous threshold level or lies outside of an acceptable interval/range (for instance in a nuclear plant).

Next, further exemplary embodiments of the invention will be explained.

In the following, exemplary embodiments of the device for designing a sensor arrangement for an automated system will be explained. However, these embodiments also apply for the automated system, for the method of designing a sensor arrangement of an automated system, for the program element and for the computer-readable medium.

The first input unit may be adapted for receiving a (user-defined or application-defined) specification of a plurality of sensors each adapted to perform at least one of the sensor measurements. The sensors may be treated as virtual sensors during the designing procedure of the device, but may then be copied 1:1 into a physical realization of the sensor system, for mounting in functional coupling to the automated system.

The first input unit may be adapted for receiving a specification of exactly one sensor adapted to perform the plurality of sensor measurements. Thus, a redundancy or interval combination of the different sensor measurement either requires the provision of a plurality of sensors which carry out the measurements at the same time or at different times, or alternatively only one sensor may be provided which carries out a plurality of sensor measurements, for instance at different instances of time. However, this is not necessary, as said earlier a single GPS receiver measures a set of pseudo-ranges.

The first input unit may further be adapted for receiving a specification of a plurality of sensor measurements to be carried out to detect at least one sensed parameter indicative of an operation state of the automated system. Therefore, the sensor system may detect physical parameters of any type which may be used as monitoring or control information for monitoring or controlling the automated system.

The second input unit may be adapted for receiving the specification of the confidence level indicative of a probability that the value of a sensed parameter detected by a respective sensor measurement deviates from the true value of the sensed parameter by less than a value indicated by the confidence region. Therefore, the confidence level may be a simple probability that the sensor/sensor measurement does or does not fail (see above definition when a sensor measurement is assumed to fail or not fail), and can be derived experimentally, empirically, or based on a theoretical model of the sensor. Therefore, no complicated error distribution function or pdf of a sensor error, which represent additional unnecessary and complex assumptions, would introduce a high degree of computational burden, has to be used, but the individual sensors are simply used as "digital" devices providing correct interval information with a first probability and a non-correct interval information with a second probability which is one minus the first probability.

The third input unit may be adapted for receiving the specification of the target confidence level indicative of a maximum tolerable probability that the automated system fails. The target confidence level is simply provided by an operator or by a client and may be the desired failure probability. The sensor arrangement is then designed so as to achieve this target confidence level (for instance a probability of avoiding a maximum credible accident in a nuclear plant).

The configuration unit may be adapted for determining, based on the confidence levels, a number of sensor measurements or a number of (possibly redundant) sensors necessary to guarantee the target confidence level. Therefore, having the possibility to implement different sensor types or sensor qualities in such a sensor system, some kind of sensor construction set or modular sensor system is provided, wherein the configuration unit selectively chooses and combines the individual sensors, determining how many sensors and how many measurements of these sensors are necessary to obtain the given target confidence level, and how they should be combined and what individual confidence levels should be used.

The configuration unit may be adapted for determining a chronology or a timing, particularly a time sequence or an acquisition rate, of the sensor measurements to meet the target confidence level. The chronology or timing, for instance a time sequence of sensor measurements, may have an impact on the entire reliability of the system, particularly when one and the same sensor carries out different measurements in time. It the context of timing management, extrapolations of sensor measurements in the future or in the past may be performed, using for instance lower and upper bounds on the variation rates of these variables, and possibly also a confidence level on this variation rate interval. Also the frequency of measurements, that is a number of measurements per time, may be used as a design parameter to obtain a sensor arrangement. The chronology of carrying out the sensor measurements may include switching on or off (or activating or deactivating) different sensors depending on the time and may allow to include—with the time parameter—a further design parameter into the sensor arrangement configuration scheme.

The configuration unit may be adapted for adjusting at least one working point of at least one sensor for carrying out at least one of the sensor measurements. A working point of a sensor may particularly be related to the flexibility when choosing the confidence level (and thus the confidence region) that is associated to a measurement. In other words: choosing the "working point" could mean choosing between using 1-$\sigma$ intervals (with confidence around 70%) or 2-$\sigma$ intervals (with confidence around 95%) or 3-$\sigma$ intervals (with confidence around 99.5%), etc. Therefore, adjusting the working point of the sensor (model) is a further degree of freedom which may be used for improving or optimizing the sensor configuration.

The configuration unit may further be adapted for adjusting a combination technique of combining the results of the plurality of sensor measurements to guarantee the target confidence level. Combining sensor results from different sensor measurements, depending on whether the sensor results are physically dependent or independent, may allow to derive a more meaningful and reliable entire probability that the system does not fail. For example, the combination technique or combining mode may include a combination of the plurality of sensor measurements comprising at least one of the group consisting of a union, an intersection, a K-in combination, and a K-best combination. Combining error intervals of the individual sensors in accordance with such a combination technique may allow to increase the entire reliability of the system, or to optimise the accuracy of the system if the overall target confidence is already reached.

The term "K-in" may particularly denote that the combination method provides every point belonging to at least K out of the N regions provided by the various sources of information The term "K-best" may particularly denote that the combination method provides every point belonging to at least K out of the N regions provided by the various sources of information, supplemented by every point of the space needed to make the overall volume connex.

The configuration unit may be adapted for configuring the plurality of sensor measurements based on an evaluation whether the plurality of sensor measurements are dependent or independent from one another. For example, different GPS sensors are dependent from one another. In case of bad weather or a fault in the satellite system involved in such a GPS sensor system, the failure of one sensor may have a consequence for the failure of the other sensor. Or, different fire sensors located in the same room may both be harmed by a fire and may therefore fail simultaneously. On the other hand, by using complementary sensor methods, it may be ruled out that two different sensors sensing the same parameter fail due to the same reason. For instance, using a magnetic position sensor and using a GPS sensor for detecting a position of a train, it can in principle be ruled out that both sensors fail due to the same reason, because the physical sensor principles are completely independent from one another. By taking into account physical independence/dependence of different sensors, the entire failure probability may be reduced.

Thus, embodiments of the invention may design an advantageous or optimal combination method (optimal in the sense: optimize accuracy while always reaching the target confidence level).

The configuration unit may be adapted for reconfiguring the plurality of sensor measurements when a determined configuration of the plurality of sensor measurements yields an obtained target confidence level which guarantees a safety of the automated system better than the specified target confidence level, wherein the reconfiguration is performed to obtain one of the group consisting of an improved accuracy, a simpler sensor arrangement, and an obtained target confidence level which is closer to the specified target confidence level. It may happen that an actual confidence level of, for instance, $1-10^{-13}$ may be obtained for the estimate, since the method has determined a very safe sensor configuration. However, when a desired target confidence level with a larger value of, for instance, $1-10^{-12}$ is sufficient, then the configuration may be re-done, with the frame condition that the result should more closely meet the desired target confidence level. This may increase the freedom in design, allowing to adapt the confidence level/confidence region of the sensor measurements, to improve another property of the designed sensor arrangement (like costs, accuracy, simplicity, or size).

The design system may be adapted to define regions in a phase space (also called state space, and which represents the unknown variables completely representing the state of the system) in which at least a part of the sensor measurements agree. For instance, when a plurality of GPS sensors detect a position, intervals may be defined in which two, three, or four sensors provide a corresponding sensor result.

The device may comprise a determining unit adapted for determining the confidence level and the (liked) confidence region for at least a part of the specified sensor measurements based on a respective predetermined sensor characteristic. For instance, having measured a sensor characteristic (for instance by measuring one hundred times a temperature using a temperature sensor which is permanently in thermal equilibrium with a reference thermal bath of a known temperature) and having derived the experimental result that the error of the sensor follows a certain distribution, it may be assumed that the failure probability equals the area of the distribution which deviates from an average value by more than a given range of, for example, $1\sigma$. However, particularly depending on the confidence level, it may be necessary to make much more measurements that one hundred, for example a million or a billion. Therefore, based on an experimental or theoretical sensor evaluation, the confidence region and its confidence level for each sensor, may be determined in a reliable manner. Required knowledge may arise from acquisition of data, statistical tests, knowledge on the physics of the sensor, etc. If these tests are available and provide a pdf, there is a flexibility on the confidence level used (and on the accuracy), even if there may be an upper value for the confidence level that can be trespassed for confidence reasons. Further, even if the distribution, or a relevant approximation thereof, is used to determine the confidence region and the associated confidence level, it is never used further in the method. In other words, the pdf is exclusively used for determining the confidence level and the linked confidence range, but preferably not for any other purpose.

The device may be adapted for designing a sensor arrangement comprising at least one of the group consisting of a position sensor, a velocity sensor, an acceleration sensor, a GPS (Global Positioning System) receiver, or receivers receiving signals from other satellites or satellite constellations (such as Glonass, EGNOS, WAAS, etc.), and a sensor for sensing a physical, chemical or biochemical parameter. The term "physical parameter" may particularly denote a temperature, a pressure, a size, etc. The term "chemical parameter" may denote a concentration, a pH-value or the like. The term "biological parameter" may include a biological activity of a sample or the presence and/or concentration of a component like a protein or a gene in a sample.

Embodiments of the invention may be implemented for designing sensor or actuator configurations for any automated systems. Exemplary fields of application of embodiments of the invention are emergency shut-down systems, fire and gas stations, turbine control, gas burner management, crane automatic safe-load indicators, guard interlocking and emergency stopping systems for machinery, medical devices, dynamic positioning, fly-by-wire operation of aircraft flight control surfaces, railway signaling systems, variable speed motor drives used to restrict speed as a means of protection, automobile indicator lights, anti-lock braking and engine-management systems, remote monitoring, operation or programming of a network-enabled process plant, an anti-collision traffic system, a nuclear plant, a chemical factory, a train, and an aircraft.

Next, principles of interval-based safety-proven estimation according to exemplary embodiments of the invention will be explained.

More and more signal processing applications require proof of their safety, especially if they are part of an automatic system where human life can be threatened. This application presents a novel state estimation technique, efficiently designed for proving the safety of the estimates. It is based on a non classical noise model which basically combines a confidence interval with its confidence level. The rationale for such a model is presented, together with a detailed overview of industrial applications for which this model is relevant. The principles for safe estimation are given in detail, both for parameter and state estimation. The extension from one to several unknowns is described. Topics as fault detection and practical determination of the (interval, confidence) couples are introduced. The strengths of the method with respect to more classical state estimation methods are discussed.

If the subsystem whose safety has to be proven deals with processing of sensor measurements, the signal processing systems that are used must prove that they reach these extremely high requirements. This question will be tackled in the following by presenting estimation methods based on a sensor model suitable for proving the safety level of the algorithms. This modelisation basically combines confidence intervals and confidence levels. The safety proof relies on optimal combination of these intervals, allowing to reach higher confidence levels for the estimates than for a single sensor, and possibly allowing to increase estimation accuracy. It might not seem unusual to consider intervals in estimation methods. On one hand it is indeed the cornerstone of bounded error methods, which provide lower and upper bounds for every variable considered (be it measurements or estimates), handing "100%"—confidence intervals. On the other hand confidence intervals on the estimated variables can always be computed when the Fill distribution is known, as is the case in Kalman filtering, where all variables are Gaussian. However, combining confidence intervals with arbitrary confidence levels for estimation purposes is a novel technique. In the following, an introduction on the safety-related rationales for the developments described herein and on the relevant engineering applications will be given. A description of the model used for the sensors, for their measurements and for the estimated variables follows. Techniques for estimation of static variables are then presented, together with the proof of the confidence levels that can be reached for the estimates. It is followed by a section on multi-variable estimation problems. The principles of the extension towards estimation of dynamic variables are then discussed.

In the following, safety requirements will be discussed.

In this context, some general considerations will be explained.

Algorithmic developments according to exemplary embodiments find their root in needs of signal processing applications where extremely high confidence or integrity is required, in the sense that it should be proven that the application has extremely low failure probabilities. For instance, a guided transport positioning application should be able to compute the position of the vehicle along the track as an interval, with an extremely high probability that the train be inside the interval. One can already see that notions of confidence intervals and confidence levels naturally appear in this framework. They will be a core of the modelisation according to an exemplary embodiment, as will be clear later.

For the sake of simplicity, the scope of the problem will be limited in several ways:

problems under consideration are signal processing applications, with direct input from sensors;

only estimation problems are considered, either parameter estimation (static) or state estimation (dynamic);

the computation of failure rates based on the failure probabilities is not performed.

The problem intended to solve is thus the following: given a target confidence level for the variables to be estimated, and provided sensor data related to them, compute confidence intervals for these variables with improved or optimized accuracy while reaching the target confidence level. This "target confidence level" is a fundamental parameter of the algorithms presented. The higher the target confidence level or integrity target, the more relevant the algorithms will be, in comparison with existing methods. Traditional methods could perform reasonably well for moderate target confidence levels, but their shortcomings will become obvious for extremely high confidence levels, needed for instance in railways positioning, where confidence levels as high as $1\ 10^{-12}$ per estimate may be required. The word "safety" is used as a generic term for the quality of a system that fails very rarely and for which it is possible to prove the failure probability. The words "integrity" and "confidence level" may be used with the same meaning: the probability of correct output of the operation considered.

In this context, some exemplary fields of applications of embodiments of the invention will be explained.

As stated above, the developments presented herein are relevant for engineering applications with very high, or even extremely high, safety requirements regarding estimation of observed variables. Positioning of guided vehicles has already been identified as relevant, but the IEC 61508 standard [2], where the safety integrity levels (SIL) are defined, provides indications about other applications where functional safety is required. Out of these, several deal with sensors for estimation and possibly control, such as (see IEC website http://www.iec.ch ): emergency shut-down systems, fire and gas systems, turbine control, gas burner management, crane automatic safe-load indicators, guard interlocking and emergency stopping systems for machinery, medical devices, dynamic positioning (control of a ship's movement when in proximity to an offshore installation), fly-by-wire operation of aircraft flight control surfaces, railway signaling systems (including moving block train signaling), variable speed motor drives used to restrict speed as a means of protection, automobile indicator lights, anti-lock braking and engine-management systems, remote monitoring, operation or programming of a network-enabled process plant, etc.

The scope of applications for IEC61508 is quite wide, and even if state estimation issues are only a small part of the overall functional safety demonstration, it is believed that the algorithms can usefully serve several applications out of the list quoted here.

In the following, a new sensor model used for an exemplary embodiment of the invention will be explained.

Next, shortcomings of traditional models will be discussed.

As presented above, a wide variety of pdf models are available as input for state estimation algorithms. Apart from the bounded error theory though, they all rely on the full description of probability density function of the variables. Using these techniques to provide high integrity measurements requires an accurate knowledge of the asymptotic behavior of the pdf for large errors. As it will be (at best) extremely difficult to gain this knowledge, this point is considered as a major impediment for safety-related applications, whose major concern is to ensure that the worst case scenario never can put the safety of the system in danger. One might object that it suffices to take an optimistic modeled distribution to remain in safety. This may be however almost impossible in practice, as the tails of the actual noise distribution are never known well enough statistically to ensure that the model is optimistic on the whole range of possible values. This issue is avoided in the theory of bounded error, which puts firm upper and lower bounds on the noise values. This approach is very appealing for safety proofs, but might lack some flexibility, especially with respect to the accuracy that can be obtained. Moreover one has to ensure that the lower and upper bounds are never trespassed, which is quite a challenge, even with loose upper and lower bounds.

Next, a confidence interval model will be explained.

Having in mind the various considerations presented above, a measurement (or sensor) model suitable for safety applications would meet the following requirements:

The results are to be provided as confidence intervals (often with very high confidence levels)

The modelisation of the noise distribution should not induce any risk with respect to the true distribution The proof of integrity should only depend on knowledge of the error distribution that is relatively easy to measure and to verify If possible, the model should provide flexibility to optimize accuracy of the estimation An elegant alternative approach consists in modeling the measurement as a confidence interval combined with its confidence level (its integrity). The interval output of every sensor j will thus, on average and a priori, meet the following equation:

$$P(\theta \not\in i_j) \leq \alpha \quad (1)$$

where $\theta$ is the real value of the measured variable, $i_j$ is the confidence interval computed for the measurement of sensor j (and $\bar{i}_j$ its complement), and $1-\alpha$ is the associated confidence level. In the remainder of this paper the Boolean event $x_j \equiv \theta \in i_j$ indicates that $\theta$ belongs to $i_j$, that is, the real value belongs to the confidence interval provided by the measurement. The event $\neg x_j$ indicates that the true value lies outside the interval computed after $i_j$ is observed. This model respects the requirements set above:

Combining confidence intervals will naturally provide other confidence intervals Usually sufficient statistical indications exist about the noise distribution to compute such a (interval, confidence) couple If some more knowledge is known about the actual distribution, the confidence interval width and confidence level may be chosen such as to optimize accuracy Equation (1) is a basic equation the following theory is built on. It should be noted that:

This model, and more particularly its confidence level, serves as prior information for the method This (confidence interval, confidence level) couple model will be noted as (I, α) couple The inequality relationship naturally complies with the safety considerations of interest The equation indicates partial knowledge about the actual noise distribution It is expected that the actual value of the measured variable sometimes lies outside the confidence interval: on average the probability of this event is below α; then, the interval is qualified (and not the sensor!) as faulty Two sensors A and B are considered as independent if the events $\bar{I}_A$ and $\bar{I}_B$ are independent This model allows to reduce the knowledge required on the actual noise distribution to a single couple (I, α), which is much less restricting and much more reliable than the traditional assumptions on the whole probability distribution function. No single additional assumption is made on the noise distribution, neither before or beyond the confidence level used. However additional knowledge about the actual distribution can be of uttermost importance, as it allows to optimally chose the confidence level assigned to each measurement. In practice the (interval, confidence) (I, α) couple or couples can be determined using datasheet information provided by the sensor manufacturer, or statistical data about the measurement error recorded in real life tests. In applications where one tries to limit the number of sensors required, it is likely that every sensor will be used with the largest confidence level that can be statistically proven to be safe. In other words, each sensor will be used with the maximum confidence level that its users grant it, indicating the trust they put on it. An advantage of the method is that no assumption is made on the noise distribution beyond this confidence level. In applications where the number of sensors is not of strategic importance, the sensors might be used with lower confidence levels, if this allows to increase accuracy of estimation.

Next, faulty sensors will be discussed in more detail.

The important issue of managing faulty sensors (not faulty intervals!) has to be carefully dealt with, as temporarily or permanently non reliable sensor data should not put the safety proof in danger. Three different solutions can be considered:

The determination of the (I, α) couple can be based on a noise distribution taking into account every possible sensor fault; this avoids the design of a fault detection module, but may strongly reduce accuracy in normal (non faulty) conditions.

If a fault detection module exists, faulty measurements can simply be omitted in the estimation process; in this case, using all other sensors, the estimation algorithm should, if possible, keep the same integrity (and probably provide a less accurate estimate). This is not always possible and the estimation algorithm will in that case mention that it cannot provide a secure estimate. This will be more or less bothersome depending on the application.

If statistical knowledge on the behavior of the fault is available, the (interval, integrity) couples can be adapted during the sensor fault, by lowering the integrity, or increasing the interval size, or both; this solution reduces the impact of the fault on the estimation process, but requires strong knowledge about the fault itself As with other estimation methods, reliable fault management is essential for the overall process to run correctly. However this question remains strongly dependent on the practical application considered. In the remainder of this explanations, it will always be considered that faults are either non existent, or excluded, or integrated in the (interval, confidence) couple determination, which allows to focus on the estimation method.

In the following, static estimation of a single variable will be described.

Given several simultaneous measurements of the same variable, all formalized as (interval, confidence) couples, there are different possibilities what can be computed as best estimate for this variable. Here, "best" may mean "a priori most accurate, while at least reaching a target confidence level". The "prior" requirement is crucial. One might be tempted to combine the measurements in an optimal way given their actual values, in order to increase accuracy, but this is in strong opposition with the fundamental measurement model of the method, which uses prior information to form the (I, α) couple. In line with this definition, as well as with the needs of safety applications (which require integrity proof before any system is actually run), the constraint may be kept to only use prior information in the design of our algorithms (not following [10], who takes posterior information into account).

Union and intersection will be discussed next.

Starting with the simple case of two available intervals $I_1$ and $I_2$, provided by two independent measurements of the same variable and with respective confidence levels $\alpha_1$ and $\alpha_2$, particularly two operations come in mind for efficient combination: the union and the intersection of these two intervals. It is easy to prove a lower bound on the confidence levels that can be granted both operations:

Union:

$$P(x_1 \vee x_2) = 1 - P(\neg x_1 \wedge \neg x_2) \quad (2)$$
$$= 1 - P(\neg x_1)P(\neg x_2) \geq 1 - \alpha_1\alpha_2$$

Intersection:

$$P(x_1 \cap x_2) = P(x_1)P(x_2) \geq (1-\alpha_1)(1-\alpha_2) \quad (3)$$

One can already identify some basic properties of these operations: union is useful for raising the confidence level of the estimate, while intersection, at the price of some confidence, might allow to increase average accuracy.

More complex combinations will be discussed next.

If more than two measurements are available, more complex combinations (which will hereafter be called combinations between the sensors) can be designed than the simple union and intersection, potentially providing an efficient trade-off between integrity and accuracy. Venn diagrams can prove useful for visualization of the situation (see FIG. 4). Successive unions and intersections of intervals provides a combination strategy, graphically represented as a subset of the measurement intervals.

A lower bound on the confidence level for the resulting interval has to be computed, given the knowledge available about the confidence for each sensor. For some simple combinations, probabilistic inference can be used to derive (possibly optimal) lower bounds on integrity. Automated but cumbersome procedures to solve such kind of problems also exist and are presented in [29]. A convenient and appealing way to combine n arbitrarily ordered intervals $i_1, i_2, \ldots, i_n$, denoted by $G_n^f(i_i, \ldots, i_n)$, consists in keeping in the final estimate every point belonging to at least (n−f) intervals (f a user-tuned parameter) out of the n available measurement intervals. In other words, the points being out of at least (f+1) intervals are left aside and do not belong to the result interval. Under the hypothesis of independence of the n measurements, it is proved that the following lower bound on integrity holds for this strategy:

$$P(G_n^f) = 1 - P\left(\bigcup_{(i_1,\ldots,i_{f+1}) \in X_{f+1}^n} \bigcap_{m=1}^{f+1} i_m\right) \geq 1 - \sum_{(i_1,\ldots,i_{f+1}) \in X_{f+1}^n} \prod_{m=1}^{f+1} \alpha_{i_m} \quad (4)$$

where $X_{f+1}^n$ indicates all possible combinations of f+1 sensors out of n.

It is worth noting that this combination includes as particular cases the union (f=n−1) and the intersection (f=0) of all available intervals. For the union the final integrity shortage (w.r.t one) is the product of the integrity shortages of the sensors, while for the intersection the shortage is equal to their sum. FIG. 5 depicts the output of the interval combination for a particular arrangement of measurements. When one speak of the K-in method, one should understand this method with f=n−K, which indeed provides all points belonging to at least K intervals.

In the following, correlations between sensors will be explained.

So far only independent sensors have been considered. However it might happen that several sensors are not independent, especially for sensors having the same physical principle. It is then possible that the unusual physical event that affects one measurement (creating a faulty measurement interval) also affects the other measurements. Such dependencies clearly have detrimental effects on the integrity of the estimate, and may be introduced in the formalism.

In the following, interval computations will be explained.

Most of the results presented so far, especially regarding the proof of integrity, are independent of the fact that it is dealt with interval computations, that is, closed segments of the real axis. Actually, as discussed in [6], operations on intervals do not always yield intervals. This for instance happens when one tries to unite two disjoint intervals. This configuration might be a normal, even if unusual, event of the method: given the exact noise distributions and the chosen (interval, confidence) couples, its probability can theoretically be computed. Keeping the result as the union of two disjoint intervals is then theoretically correct, but it is also allowed to consider the result as the close interval (easier to handle in practice) between the lower bound of the lower interval and the upper bound of the upper interval, as this does not put in danger the overall integrity but only reduces the accuracy of the method. Another issue is raised when the actual result of the combination is a void interval (think of the intersection of two disjoint intervals, again). If this happens, one can again conform to theory and keep the null interval; if for practical reasons an interval has to provided, any interval can serve as a result, without putting the integrity proof in danger.

Next, some aspects related to accuracy will be explained.

The algorithms presented have as foremost objective the proof of confidence for interval estimates. Now that this target has been reached, arises the second objective of optimization of accuracy. In the framework presented herein, accuracy is defined as the mean size of intervals estimates. For a given combination procedure, it may be desirable to know about this mean size, or at least to have an indication of its order of magnitude, which would allow, for instance, to compare with respect to accuracy several combinations reaching the same confidence. For same cases, the measurement model may not naturally allow such a comparison. The restricted statistical modelisation of the measurement noise only requires a single (interval, confidence) couple, leaving unknown every other information about the noise distribution. This hampers, among others, the computation of expectations on the distribution, an operation needed for evaluation of accuracy of the methods. Prior determination of the combination accuracy seems thus difficult. In many particular cases an order of magnitude can be computed, though. In the method presented above, for instance, it is believed that on average the resulting confidence interval will have the same magnitude as the K-th most accurate sensor. For more complex combinations similar conclusions might be more difficult to draw.

There is a second way to obtain indications of accuracy, consisting in making approximations of the actual distribution (say, have it Gaussian) compatible with the (interval, confidence) couple chosen. For simple combinations, one can then compute the full distribution of the size of the resulting interval, which then provides the accuracy as the mean of this distribution. This is likely to give a good indication of the accuracy of the method, but can never be ensured to be the actual accuracy, as other approximate distributions, possibly giving worse final accuracy, can be compatible with the chosen (interval, confidence) couple.

In the following, solutions for a multivariable problem will be given.

The static problem presented so far has made the assumptions that:
- a single variable is to be estimated
- the measurements are direct measurement of that variable To conform with practical problems, these two assumptions may be released. Indeed a single measurement can be related to several unknown variables, requiring to invert the one-dimensional measurement function towards the (possibly multidimensional) space of the parameters to be estimated. The aspects of function inversion are very much similar to mature theories already developed in the frame of bounded error estimation [6], and will not be discussed in detail here. The function inversion procedure, applied on a single interval, will provide a region of the state space, which is the multidimensional counterpart of a 1D interval (see FIG. 6 for a sketch). This region is in general not bounded. The probability that the vector of parameters be in that region is, in case of an exact function inversion, exactly the same as the probability that the real measured value be in the measurement confidence interval.

Once this function inversion operation is performed for every available measurement, a combination procedure can be performed, with exactly the same principles as the combinations performed on intervals presented above. Again combinations such as the union, the intersection or the K-in or K-best can be performed. The only difference is the nature of the region resulting from the combination. While it was a simple interval, it has now become a possibly unbounded, possibly multifaceted, possibly curved, region of the multidimensional parameter space. The strong advantage of the method remains, namely that it is still possible to prove a lower bound on the probability for the true parameter vector to be in that region. The practical techniques for management of these sophisticated regions can quickly become cumbersome. They can be efficiently dealt with via clever pavements of the parameter space, as is discussed in [6].

In the following, aspects with regard to dynamic estimation will be mentioned.

The methods presented so far dealt with estimation of static parameters (constant values), observed by several sensors. However, the described developments can be extended towards estimation of dynamic variables, a problem commonly known as state estimation. It is referred to [3] or to any introductory book on state estimation for presenting the issue. This extension is a natural one, as it seems reasonable that the information brought by measurements, describing state variables whose time evolution is partly known and sometimes slow, not only can be used for estimation at the time they are performed, but also can be used for estimation of the same variables in the future. Several questions arise as basic considerations for the development of this new state estimation algorithm:

1. How is process noise to be described?
2. How can past measurements be propagated in time?
3. How can past measurements be combined with current measurements?
4. How is time-correlation to be modeled?

The answers provided to these questions, presented in more detail in the following, can be summarized as follows:

1. The process noises will use the same model as the measurement noises, that is, couples (interval, confidence), so that every variable of the method uses the same mathematical model based on confidence intervals.
2. Past measurements are not propagated in time as such, it is rather the region they delimit in the state space that is propagated in time, using the model previously defined for process noises.
3. Past and new measurements all delimit regions of the state space; the integrities of these regions can be combined in combination procedures in exactly the same way as for static combinations.
4. For each sensor, time-correlation can be described with probabilities that successive faulty intervals occur.

Here again strong common aspects exist with the bounded error theory [6], especially regarding function inversion and time propagation of intervals. However all aspects regarding integrity (definition, propagation, combination, error correlation) are particular to the developments described herein.

State equation and process noise will be the subject of the following considerations.

The new component of this state estimation problem, with respect to the parameter estimation problem, is the state equation, describing the time evolution of the state variables. As perfect knowledge about this evolution is usually not available, the uncertainty is modeled using so-called process noises, acting exactly the same way as measurement noises for the measurement equation. In the framework disclosed herein, modeling consistency is achieved if every variable is modeled the same way, as a couple (interval, confidence) for 1D problems, or as a couple (region, confidence) for multidimensional problems.

While this is already the case for the measurements and their inverses in the state space, it will as well be the case for the state variables if and only if also the process noises follow the same model. Practical determination of the confidence levels and confidence intervals for the process noises will bring the same difficulties as its counterpart for measurement noises. Here again knowledge about the physics of the process is of uttermost importance, as for instance upper and lower bounds on time-variation of state variables can be directly integrated in the model.

Next, the time propagation of variables will be discussed.

Time propagation is most naturally done on state variables, as the state equation describes their evolution in time. This can be used in several ways for propagating in time the information related to measurements. The first method consists in directly propagating the measurements, while the second consists in extrapolating estimates of the state variables.

1. Propagation of measurements. Actually measurements cannot be extrapolated in time as such, because their time evolution is not known, and it may be necessary to first invert the measurements towards the state space, as described above. The limiting regions are then propagated in time, using the state equation and the process noise models, providing modified state regions (see also [6] for time propagation of bounded zones). These zones indicate which state vectors are compatible with the extrapolated measurements, and can perfectly serve as complementary measurements to the measurements currently available, even if probably less accurate (due to the additional uncertainties related to delay in time) or less reliable.

2. Propagation of estimates. As output of some suitable combination procedure, the filtering algorithm provides a (I, $\alpha$) estimate of the state vector at every time step. This estimate reflects all previous measurements that contributed to its computation. As it is expressed in the state variables, it can be propagated, taking again into account the process noises expressed as (interval, confidence) couples. Once extrapolated, it can be combined with the new measurements, to provide an updated state estimate (see FIG. 7). One recognizes a structure close to the predictor/corrector sequence that can be found in many state filtering algorithms.

Combination procedures will be discussed next.

The combination of state space regions (N-dimensional counterparts of intervals) together with their confidence levels (integrities) proceed the same way for the dynamic problem as for the static case: clever combinations of union and intersections can be performed, to reach the required target integrity. In the state space, these unions and intersections provide a final region, with a priori known integrity but with unknown a priori accuracy. These computations of integrity are exactly the same as before because they are not related to the nature of state estimation but only related to logical considerations for the events "the intervals are faulty or not". However, two additional issues appear for this combination: first the massive number of available intervals, and second the time correlation of faulty sensors. The number of available intervals can indeed become huge, as every former measurement (or estimate) can be propagated in time and used in the combination. Although having some more available measurements is certainly an advantage, for instance to reach the target integrity or to increase accuracy, having too many is a drawback, because blind application of the K-in combination (for instance) with many intervals can be shown to induce a loss of integrity without gain of accuracy. A solution lies in careful choice of the measurements used, which should be improved or optimal in number and in size and integrated in a convenient K-in combination, with both the number of measurements and the vote adapted to the target integrity. While the above argumentation holds for propagation of measurements, it may be less relevant if a strategy propagation of estimates is chosen. In this case the measurements used in the combinations should be tracked, as they will have an impact on the definition of the dependencies between measurements.

The second issue is the time-correlation of faulty intervals. It seems indeed likely that a sensor providing a faulty interval at a given time step also makes a mistake at the next time step, and/or made a mistake at the previous time step. In other words, the successive measurements provided by a single sensor should not be considered as independent (in the sense it may be defined: two intervals A and B are considered as independent if the two events "the true value is not in interval A" and "the true value is not in interval B" are independent). If a description of the time correlation between successive errors is available, it can be integrated in the combination procedure, as it is equivalent to dependencies between sensors for the static case. This issue is a touchy one, as underestimating the correlation between successive errors might put the integrity proof in danger. It is directly related to the determination of a correct model of the measurements, which includes modelisation of time-dependence of sensor errors, in addition to the (interval, confidence) couple and to dependencies between sensors. A last question concerns the accuracy of the combination methods, for which the same obstacles may occur as for the static. Indications of the order of magnitude of the final interval (or region) size can again be obtained if hypotheses are made about the actual distribution underlying the (I, α) couple used, but this is in no way a proof of accuracy of the method, as other distributions also compatible with that model would provide different accuracies The principles of the state estimation technique has been presented. Its purpose is to prove the confidence level of the estimates, expressed either as confidence intervals for 1D problems or as confidence "regions" of the state space for multidimensional problems. This has been achieved through a model for both measurement and process noises, expressed as (confidence interval, confidence level) couples. The final integrity, required to reach the target integrity, is a direct result of the described algorithm, rather than the final accuracy, which without additional assumptions can at best be estimated. These confidence interval-based estimation techniques provide safety proofs in a clear, direct and safe way. Part of their strength come from the fact that only limited statistical information is required about the noise distribution, a single (interval, confidence) couple in practice. Additional information about this distribution can be used to optimize the integrity and the accuracy of the method. This framework is relevant for the train sector and other industrial sectors as well, where safety has to be proven for automatic sensor processing applications. Due to the very restricted statistical knowledge required for the noises, the techniques strongly differ from classical pdf-based state filtering techniques. Interval-based techniques provide a much more natural framework for integrity proof, mostly because combinations of confidence intervals directly provide confidence intervals, and because it is easier to verify the absence of optimistic assumptions on the noise distributions.

With respect to an interval-based state estimation method, namely the bounded error theory, the disclosed algorithms provide an important extension towards arbitrary confidence levels, which are believed can provide large improvements in estimation accuracy. Practical aspects of determination of the (interval, confidence) couples, formalization of dependencies, determination of the final integrity, management of the multidimensional volumes, are issues which are known as such by the skilled person.

Next, further exemplary aspects of the invention will be presented:

Proven region localization: Localization method, technique or device, based on combinations of sensor outputs, with measurements all delimiting regions (or zones) of the space with lower probabilities (or confidence levels) that the measured quantities be in those regions, the method providing the location expressed as a region of the space associated to a proven lower bound on probability (or confidence level) that the true location be in that region Physical variables: the variables may be the true physical dimensions of the space Virtual variables: part or all the variables may be not physical dimensions of the space but may represent other (physical) variables relevant for the practical purpose of the location Region combination: the proof of the lower bound on the probability of inclusion of the true location in the computed region may be based on global improvement or optimization tools such as linear programming, which provide an improved or the optimal lower bound for the particular combination method chosen Union: the chosen combination method provides the union of the regions provided by the various sources of information (and the lower bound on probability of inclusion is equal to I-complement of the product of the probability shortages for each information source in case of independent information sources)

Intersection: the chosen combination method may provide the intersection of the regions provided by the various sources of information K-in-N: the chosen combination method may provide every point belonging to at least K out of the N regions provided by the various sources of information K-best-of-N: the chosen combination method may provide every point belonging to at least K out of the N regions provided by the various sources of information, supplemented by every point of the space needed to make the overall volume connected Time propagation of measurements: part or all of the measurements (both the region and the confidence level) may be extrapolated in time towards the moment where the location (combination of regions) takes place, where the time variation of the measurements may be defined as an interval associated to a confidence level Min-max time propagation: the time variation of the measurements may be defined with its lower (minimum) and upper (maximum) values Dynamic problem: the time variation of the variables may be known and defined as an interval associated to a confidence level Time propagation of combinations: part or all of the sources of information used in the combination of regions may be former (or later) combinations that have been extrapolated in time towards the moment where the location takes place, using the said knowledge about the time variation of the variables Single estimated variable: a single variable may be estimated, the resulting region being a one-dimensional interval or union of intervals Independence: the measurements are independent, in the sense that there may be statistical independence between the invalidity of several measurements (invalid in the sense that the true value does not lie in the given region)

Measurement probabilities: the probabilities associated to the measurements may be not the same (different)

Left-right errors: the probability shortage (or default) associated to the (one-dimensional-like) measurements may be evenly distributed between the left and the right of the delimiting zone, and this particularity may be exploited to compute an improved lower bound on the confidence of the location estimates Coordinate systems: the coordinate systems used by the various measuring devices may be not the same Cdf optimization: some or all the measuring devices can provide several delimiting zones (with associated probabilities), and this particularity may be exploited to determine, given a target lower bound on probability for the location estimation, an combination strategy which optimizes the accuracy of the location (defined as the volume of the location volume)

Accuracy optimization: given a target lower bound on probability for the location estimation, an combination strategy may be defined which is optimal in the sense of probability or in the sense of accuracy of the location Position: every measurement may provide a subset of the physical space, so that the resulting region is a subset of the physical space (a zone of $R^3$)

Speed: every measurement may provide a subset of the space of physical speeds, so that the resulting region is a speed represented as a subset of the $R^3$ space Constraints: additional constraints may exist on the location to be evaluated, restricting the possible locations to a subset of the space Map-matching: the constraints on the location may arise from the knowledge of a map of the network on which the mobile is due to lie Transport modes: the scheme may be applied to any transport mode Train positioning: the technique may be applied to the problem of estimating the location of a train along a known network of railway tracks GPS: the measuring devices may be UPS receivers, so that each measurement is a time-delay between the receiver and an identified GPS satellite, so that if the track is known, the method may compute simultaneously the position of the train along the track and the clock drift of the GPS receiver (see FIG. 8)

GNSS: with any other satellite constellation

SBAS: information provided by Space-Based Augmentation Systels (SBAS) may be employed to adapt the combination procedure, either by modifying the probability attributed to a given measurement or adapting the size and shape of the measurement region Beacons: may be applied to equipment providing measurements of distance or time delay between the sensing equipment and the emitting base (GNSS, GSM, Wifi, etc.)

Sensors: may be extended to any number of sensors (information sources), as far as the location problem can be described with variables that can be related to the measured variables Extensions: any physical apparatus using measurements expressed as confidence zones associated to confidence levels in order to evaluate (estimate) a variable as a confidence zone associated to a confidence level In the following, some strategies for combining intervals for the dynamic problem will be explained. The design of some combination strategies in the dynamic case will be therefore explained in the following.

Again, as in the static case, a large number of region combination strategies can be designed, especially as the possibility of time-propagation of regions (or intervals) provides a huge number of available and potentially usable regions that can be combined.

Several such strategies will be described here:

Propagation of Measurements:

At each time step the following steps are performed:
    Propagate the former measurements
    Rank them by increasing size
    Take just enough small regions required to reach integrity target by performing the union of these regions
    The resulting estimate is that region
    We could also consider to remove some of these small regions and/or to add larger regions and perform a more sophisticated combination (like the K-in combination) than the union, so that the target confidence level is closer met Propagation of Combinations:

At each time step the following steps are performed:
    Consider all available measurement regions and compute the lack of integrity of the union of these regions with respect to the target confidence level (possibly taking into account the loss of confidence related to time propagation)
    Determine (for instance) a K-in or K-best combination that at the former time-step at least reaches that lack of integrity (possibly taking into account the loss of confidence related to time propagation)
    Perform at the former time-step that particular combination and propagate it along time
    Perform the union of that propagated region and of the available measurements Off-Line Strategy:

It is impossible to determine the best (i.e. most precise) secure interval without knowing the probability distribution of the sensors. In some cases, it is however possible to determine a very good strategy off-line.

The Off-Line strategy is only applicable if the sensors integrity and interval size are constant, and where the sensors readings arrive at regular intervals. In such a case, we can describe the information we receive like S_at: The interval from sensor "a" (with its associated integrity) received "t" time ticks ago. We decide beforehand to use only intervals dating at most T time ticks ago, and compute all possible combinations of S's that satisfy the target integrity (which reduces to solving a number of linear optimization problems). We then make a long test run, recording the sensors readings, and chose the combination that would have been best for this test run. This is the combination we then use in the future: the "Best off-line strategy".

The criteria used when selecting the best combination will probably often be the smallest average size, but it can be adapted on the needs of the application. E.g. smallest maximum size, smallest size for 95% of the cases.

The sensors must provide reading at regular intervals, and their interval size and integrity must be fixed.

Adaptive Strategy:

Some sensors do not provide intervals of fixed size, or have a fixed integrity, but these values change much less rapidly then the sensor's frequency (i.e. the impact of satellite configuration on a GPS). In this case, one can adapt the Off-Line strategy, at the expense of more on-line computations.

As before, we decide to only use measurements that are at most T ticks old. We compute which interval combinations (with there present integrity) satisfy the integrity target. We then compute which of these combinations would have given the best result if used in the past, from time "CurentTime-T-K" to time "CurentTime-T-1" where K is a suitably chose constant. This is the combination we then use at the current instant.

It should be noted that the measurements used to determine the combination to use at the current time are different than the measurements used to give the interval at the current time. This is crucial to prove the integrity of this method.

A large number of computations must be made on-line, and one must remember a large number of past measurements. This can be mitigated by using the same combination for a certain time, only re-computing a new combination when the sensors characteristics have changed noticeably. In this case, one must be careful that the combination used always satisfies the integrity target, even if the integrity of some sensors changes slightly.

Contrarily to the offline technique, this method relies heavily on the independence of sensor measurements in time. It will have to be heavily adapted (or dropped) when this restriction is lifted.

This technique can occasionally give a rather bad combination (from a precision point of view, the integrity is always assured). If the sensors characteristics do not change too quickly, this can be mitigated by determining the best combination on a long enough time period (e.g. choosing a large K in the formulas above).

Mixed Strategy:

A mixed strategy is a technique to improve average accuracy in cases where the best-known strategy is (much) more secure then the target integrity, and where we know a strategy that is more precise but does not satisfy the target integrity. In such a case, it is possible to alternate between these two strategies, in such a way that we satisfy the target integrity on average.

Let suppose that the integrity of the secure and insecure strategies are respectively S and I, and that the target integrity is T. Then one may use the insecure strategy (T-I)/(S-I) percent of the times, and one will still satisfy the target integrity.

Next, the computation of lower bounds on confidence for interval combinations will be described, especially for complex combinations (requiring the use of automatic methods: linear programming). The use of linear programming for proving the lower bound on confidence level for a given combination technique will therefore be explained in the following (mathematical programming).

Proper or even the best possible bounds on the probabilities of interval combinations more complex than unions and intersections can be derived quite straightforwardly by linear programming. The linear programming (or linear optimization) problem consists of minimizing (or maximizing) a linear objective function of several variables on a polyhedron specified by non-negativity constraints of these variables, expressed by linear inequations. Linear programming belongs to the theory of convex optimization. The linear programming problem can be solved by the Simplex Algorithm, which consists of efficiently moving around on the edges of the polyhedron until the optimal solution is reached.

In the problem of deriving bounds on the integrity of a combination of intervals, the objective function (to be maximized in the case of an upper bound or minimized in the case of a lower bound) stands for the probability that the unknown parameter lies inside this interval combination. The measurements observed through confidence intervals suggest various possible combinations of values for the Boolean variables expressing whether the actual parameter lies in each confidence interval. To each combination of Boolean values is assigned a probability symbolized by a random variable taking its values in [0,1]. These 'probability variables' are the positive variables of the linear programming problem. The technological constraints of the linear programming problem are given by:

bounds on the marginal probabilities of each confidence interval collected (e.g.: $P(\theta \notin i) \leq \alpha$)

the constraint issued from the Law of Total Probabilities expressing that the sum of all the probability variables is 1 (e.g.: $P(\theta \in i) + P(\theta \notin i) = 1$).

additional constraints on the probabilities of 'simple' interval combinations (intersection, union, . . . ) if such constraints are known (e.g.: $P(\theta \notin i_1 | \theta \notin i_2) \leq \alpha_1 \alpha_2$)

additional constraints on the correlations between the probability variables expressed as conditional probabilities (e.g.: $P(\theta \notin i_2 | \theta \notin i_j) \leq \alpha_{12}$)

As said above, the constraints and the objective function partitionate the (discrete) space of the Boolean variables into a finite number N of distinct regions. To each of these regions corresponds a certain logical combination of the elementary Boolean events (for instance $x_1 \wedge x_2 \wedge \neg x_4$), whose probability is given the random variable $p_j$ (j=1, . . . ,N). The total probability constraint gives $$\sum_{j=1}^{N} p_j = 1, \tag{5}$$

where N is the number of regions of the Boolean event space, and thus the minimum number of logical combinations of Boolean events needed to express all the constraints. The remaining N' constraints can be written under the form:

$$P(\phi_i|\phi_j) \sim b_i \qquad (6)$$

where $0 \leq b_i \leq 1$ and '~' stands for either '$\leq$' or '$\geq$'. By using, according to the suggestion of [29], the equation $$P(\phi_i \mid \phi_j) = P(\phi_i, \phi_j)/P(\phi_j) \qquad (7)$$
$$= P(\phi_i, \phi_j)/(P(\phi_i, \phi_j) + P(\neg \phi_i, \phi_j)),$$

we have $$(1 - b_i)P(\phi_i, \phi_j) - b_i P(\neg \phi_i, \phi_j) \sim 0$$

$$\Leftrightarrow \begin{cases} (1-b_i)P(\phi_i,\phi_j) - b_i P(\neg \phi_i, \phi_j) \mp p'_i = 0 \\ p'_i \geq 0 \end{cases} \qquad (8)$$

where $p'_i$ are artificial positive variables and $P(\phi_i,\phi_j)$ and $P(\neg \phi_i,\phi_j)$ can be expressed as sums of variables chosen amongst the N variables $p_i$. The objective function, to which variable y is assigned, can also be written as a combination of the variables $p_i$. Hence the problem can be rewritten under the form of a system of N'+2 equations with N+N'+1 unknowns great or equal to 0, which corresponds to the standard form of the linear programming problem:

$$y - \sum_{j=1}^{N} o_j p_j = 0 \text{ subject to the constraints} \qquad (9)$$

$$\sum_{j=1}^{N} a_{ij} p_j \mp p'_i = b'_i, \qquad (10)$$

$i = 1, \ldots, N'$, and $$\sum_{j=1}^{N} p_j = 1 \qquad (11)$$

where $b'_i$ is $b_i$ or 0 if the i th constraint involves a marginal or conditional probability respectively. For each instantiation of the parameters $b_i$, an efficient solution of the problem is given by the Simplex algorithm. Indeed, this inference problem was formalized in [30, 31], and can be solved efficiently for fixed values of the probability bounds of the integrity constraints.

In the following, exploitation of the constraints of dependence between confidence intervals will be explained.

In Boolean algebra, the most simple Boolean formulas are the conjunction and the disjunction operators. In the case of two variables with known probability intervals, the probability bounds of the conjunction and the disjunction of two variables with bounded probabilities are given by the Boole-Fréchet bounds.

For two confidence intervals $i_1$ and $i_2$ of respective maximum risks $\alpha_1$ and $\alpha_2$, the worst-case bounds for the probabilities of the disjunction and conjunction of the corresponding Boolean events lead to safe lower bounds for the probabilities of the union and the intersection of the confidence intervals, given by $$P(\theta \notin i_1 \cup i_2) \leq \min(\alpha_1, \alpha_2), \qquad (12)$$

$$P(\theta \notin i_1 \cap i_2) \leq \min(1, \alpha_1 + \alpha_2) \qquad (13)$$

The conjunction operator helps to better identify the stochastic parameters that rule the system inside their definition spaces. A special case is when one variable is (locally) a more 'accurate' observer of those parameters than the other, in the sense that the realization of this variable implies the realization of the other. Then the conjunction has the property to select the most informative variable amongst them. Speaking in terms of intervals, the intersection operator has the property to automatically select the most 'accurate' interval among a collection of observed intervals. The automatic selection of the most accurate intervals is the basis of our fault-tolerant fusion method.

The disjunction operator allows to reach high integrity levels by exploiting additional knowledge on the correlations between the variables.

The modelling used for representing and exploiting the dependence constraints between intervals is specially adapted for the context of bounded probabilities. Extending the idea of making assumptions on the nature of the dependencies (maximum, minimum, non-negative correlations or independence) to problems where only lower bounds on the probabilities of the variables are known, the information on the correlations of the intervals is used to derive tighter lower bounds on the probabilities of the union and intersection:

$$P(\theta \notin i_1 \cup i_2) \leq \alpha_{1,2}, \qquad (14)$$

$$P(\theta \notin i_1 \cap i_2) \leq \min(1, \alpha_1 + \alpha_2 - \alpha'_{1,2}), \qquad (15)$$

with $0 \leq \alpha'_{1,2} \leq \alpha_{1,2} \leq \min(\alpha_1, \alpha_2) 0$. Under the idealistic hypothesis of independent measurements, the upper bounds on the risks of the union given by the first equation vanish from $\min(\alpha_1, \alpha_2)$ to $\alpha_1 \alpha_2$, which are respectively of first and second order in terms of $\alpha_k$. Consequently, when dealing with high integrities, that is for small values of the risks $\alpha_1$ and $\alpha_2$, the union operator can lower significantly the worst-case risk of nearly-independent confidence intervals, with respect to the individual risks of these intervals. On the other hand, it can be seen from the second equation that the interest of bound $\alpha'_{1,2}$ is less obvious, as the intersection leads at best to the reduction of the worst-case risk by half. Therefore, only the first equation is taken into consideration and we count on the existence of lower bounds for the probabilities of unions of intervals.

Modelling the correlations between two Boolean events can easily be extended to more than to more than two variables. The dependency constraint between n confidence intervals $i_1, i_2, \ldots, i_n$ in is modelled as follows:

$$P(\theta \notin i_1 \cup i_2 \cup \ldots \cup i_n) \leq \alpha_{1,2,\ldots,n}, \qquad (16)$$

where it is assumed that the parameter $\alpha_{1,2,\ldots,n}$, ideally lying close to the independence value $\alpha_1 \alpha_2 \ldots \alpha_n$, can be safely provided.

The aspects defined above and farther aspects of the invention are apparent from the examples of embodiment to be described hereinafter and are explained with reference to these examples of embodiment.

The invention will be described in more detail hereinafter with reference to examples of embodiment but to which the invention is not limited.

Figure 1:
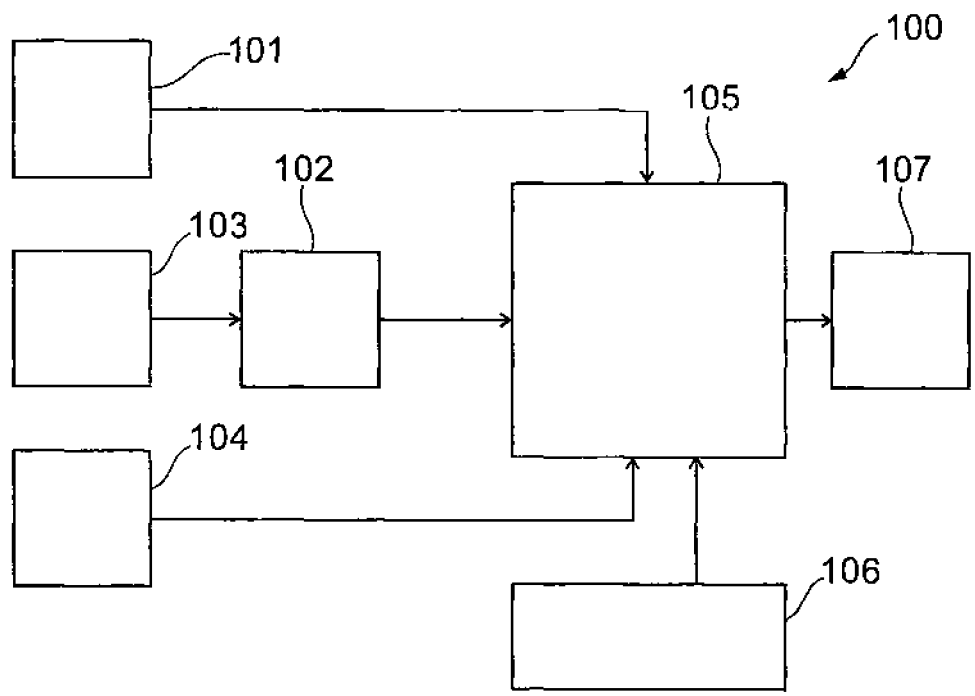
FIG. 1 illustrates a device for designing a sensor arrangement for an automated system according to an exemplary embodiment of the invention.

The illustration in the drawing is schematically.

In the following, referring to FIG. 1, a design device 100 for designing a sensor arrangement for an automated system, for instance for designing a position determination arrangement for an automatically controlled train, according to an exemplary embodiment of the invention will be explained.

The device 100 comprises a first input unit 101 for receiving a specification of a plurality of sensor measurements to be carried out by the sensor arrangement. This may be a description of these sensor measurements which may be different position measurements performed for controlling the train.

Furthermore, a second input unit 102 is shown for receiving a specification of a confidence region together with an associated confidence level for each of the specified sensor measurements. Such a confidence level may be a number of $1-10^{-4}$, namely a probability that one of the sensor measurement does not fail. Such a confidence region or confidence range (which may be an integer or non integer multiple of the root mean square deviation $\sigma$) may be an interval indicative of a maximum deviation of a measured value of a parameter from the real value which deviation still allows to consider the measurement to be "successful". In the case of a larger deviation, the measurement is considered to fail.

As can be taken from FIG. 1, such a confidence region together with an associated confidence level may be supplied to the second input unit 102 from a determining unit 103 adapted for determining the confidence level for each of the specified sensor measurements based on a respective sensor characteristic. For example, when experimental measurements have shown that a particular one of the position sensors has a Gaussian distribution when measuring one and the same position a plurality of times, it may be made an assumption that the position detection is still sufficient when it deviates less than $3.5\sigma$ (wherein $\sigma$ is the expectation value) from the center of the Gaussian distribution. Based on such an assumption, and using some integration methods, the confidence regions and their confidence levels for the individual position sensors may be determined and supplied to the second input unit 102.

Furthermore, a third input unit 104 is provided for receiving a specification of a target confidence level for the automated system. For instance, an operator of the automatic train may define the frame condition that the reliability of the train control has to be at least $1-10^{-12}$. In other words, only once every $10^{-12}$ position estimation, in the statistical average, a failure occurs.

All these inputs of the input units 101, 102 and 104 are supplied to inputs of the configuration unit 105. The configuration unit 105 may be a microprocessor, for instance a CPU, or a computer.

Furthermore, a user input/output unit 106 is provided which allows a human user to input frame conditions, for instance to define or specify the scenario of the automated system, define parameters indicative of the automated system to be simulated, select operation modes of the system 100, etc. The input/output device 106 may include a graphical user interface (GUI) comprising a display for displaying any information. Furthermore, input elements like a keypad, a joystick, a trackball, or even a microphone of a voice recognition system maybe part of the input/output device 106.

The configuration unit 105 is adapted for configuring the plurality of sensor measurements and for configuring the combination of the sensor measurements in a manner to guarantee the target confidence level for the automated system. It may configure the plurality of sensor measurements specified by the first input unit in a manner to design the sensor arrangement to guarantee the specified target confidence level specified by the third input unit 104 for the automated system by configuring a manner of evaluating results of the sensor measurements in combination.

In other words, the frame conditions of the measurement scenario defined by the input units 101, 102 and 104 may be combined in a manner to specify how many and which sensors are needed, how many sensor measurements shall be carried out by each of the sensors, of which physical kind the sensors should be, whether they should be independent or dependent from one another, and how the error intervals of the different sensors shall be combined to achieve the goal that the target confidence level defined via the third input unit 104 is met. When such a configuration has been found, it is output to an output unit 107 which displays the virtual sensor arrangement for the automatic system. This virtual specification can then be transferred into the real world by constructing the sensor arrangement in accordance with the definitions derivable from the output unit 107. It is also possible that the output unit 107 outputs a complete description of how to physically construct the sensor system.

According to an exemplary embodiment, developments on interval estimation may be enabled or simplified. The described embodiments are especially applicable where safety is required. For this purpose, a method is provided for estimating unknown variables as confidence intervals with the proof of the confidence.

One exemplary field of application is train positioning safety. For instance, a goal may be to achieve an SIL4 level, for instance a target failure rate of $10^{-9}$/h. For this purpose, it may be advantageous to provide position and speed intervals with extremely high confidence levels.

However, this specific embodiment may be generalized to provide an estimation theory with confidence intervals. This may of course be implemented in the context of positioning applications. Particularly, a safe GNSS positioning maybe made possible. Embodiments of the invention may be implemented in the context of other technical fields as well (for instance with all technical fields for which the IEC61508 standard is relevant).

A framework of embodiments of the invention is the problem of state estimation in automated systems. The evolution in time of a system may be observed via measurements. Such an estimation may be closely related to the control of an automated system. For instance, the state of such a system may be described by state variables (for instance position, speed). Particularly, two ingredients are combined: Firstly, the state equation, namely the (approximate) knowledge about the law of evolution of state variables in time. Secondly, the observation equation, namely a (noisy) link between observations and state variables.

According to an interval model for measurements, couples (interval, confidence) may be implemented according to the equation (1). The model according to embodiments of the invention is related to the error distribution of a sensor, which is at least partially known. However, it may be derived from a theoretical model of the sensor, or may be measured experimentally. An a priori expectation over all possible cases may be carried out. It is possible to define always lower bounds on confidence. Invalid measurements (=error event) occur if the true value is not in the interval (with a probability of less or equal than $\alpha$, wherein $\alpha$ is defined in equation (1)).

Figure 2:
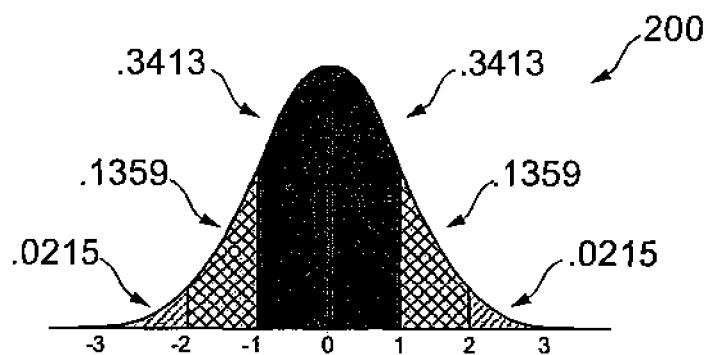
FIG. 2 illustrates a Gaussian distribution of a sensor measurement result of a sensor.

FIG. 2 shows a diagram 200 illustrating a Gaussian distribution of a sensor.

According to an exemplary embodiment of the invention, such pre-known or measurable information about the sensor may be used to derive a combination of a confidence region (interval here) and a confidence level, namely a lower bound on the probability that the true value is in the confidence region. For instance, an "acceptable" or "error-free" measurement may be defined as a measurement in which the output parameter is within a confidence range/confidence interval of $2\sigma$ around the maximum of the curve shown in FIG. 2. The probability that a measurement for this sensor is considered to be correct may then be defined as 0.3413+0.3413+0.1359+0.1359=0.9544. With a probability of 4.56%, the interval measurement is deemed to fail. With a probability of 95.44%, the sensor is deemed to deliver a correct result. Thus, the reliability of the sensor is described by a single confidence level, instead of describing it by a complex curve as the Gaussian distribution of FIG. 2.

Figure 3:
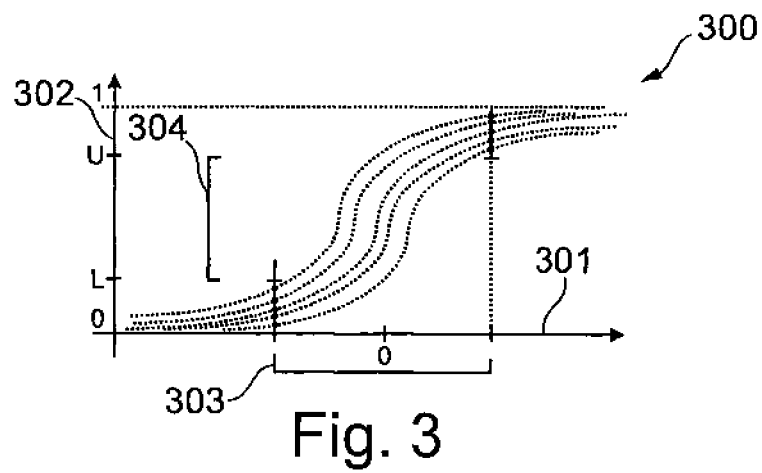
FIG. 3 illustrates a diagram indicating a family of cumulative distribution functions compatible with a confidence interval associated to a confidence level.

FIG. 3 illustrates a diagram 300.

The diagram 300 has an abscissa 301 along which the measurement error of the sensor is plotted. Along an ordinate 302, the family of cumulative distribution functions is plotted. A chosen confidence interval (or region) is denoted with reference numeral 303. Furthermore, an associated save confidence level 304 is plotted (=U−L).

According to exemplary embodiments of the invention, it is possible to combine individual intervals. Particularly, intervals about a single variable at a single moment may be known. Combinations of (interval, confidence) couples can be performed for computation of a better (interval, confidence) couple. In this context, operations like union, intersection, K-in, K-best, or any other operation may be implemented.

Figure 4:
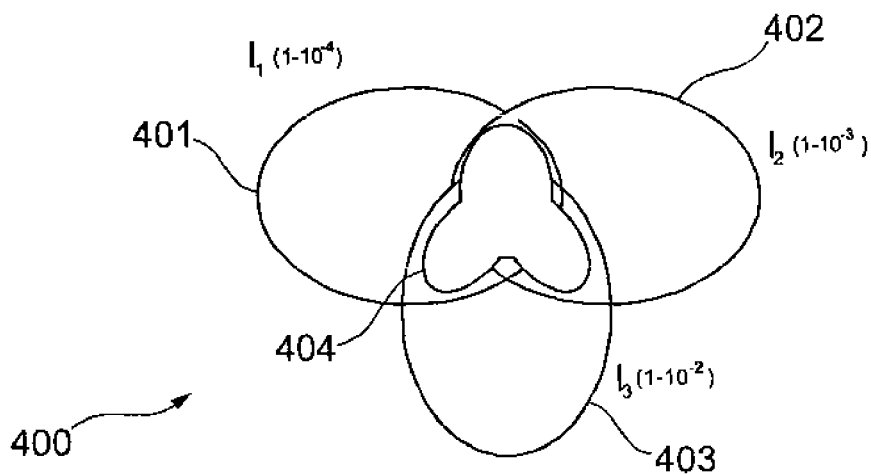
FIG. 4 illustrates a Venn diagram combining three measurement intervals (centered around the true value) of three sensors.

However, more complex combinations can be designed. Venn diagrams like 400 shown in FIG. 4 can be used for this purpose, where shaded regions indicate which part of the space is kept for computing the estimate. This is independent of the dimensionality of the measurements (1D or higher).

The Venn diagram 400 illustrates three circles 401, 402, 403 indicative of three different sensor measurements or sensors. A confidence level is shown for each of the circles 401 to 403 (for sensor 1—circle 401:1-10$^{-4}$). A combination of these three intervals is shown as a cloud 404, wherein this cloud 404 includes portions where two of the three intervals 401 to 403 overlap, including of course the portion where all three intervals overlap. This illustrates the 2-in combination (K-in where K is equal to 2)

The associated integrity can be computed (for instance analytically/numerically).

This provides a demonstration of the prior resulting confidence.

Figure 5:
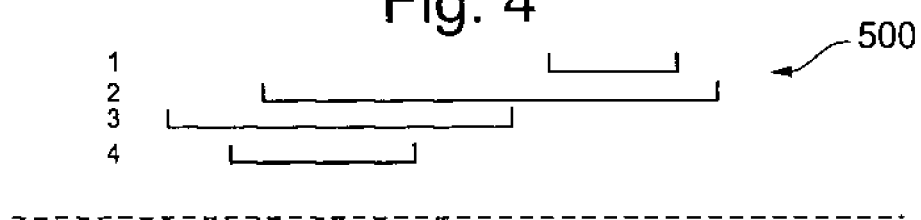
FIG. 5 illustrates different combination schemes for combining measurement intervals of sensors.
Figure 5:
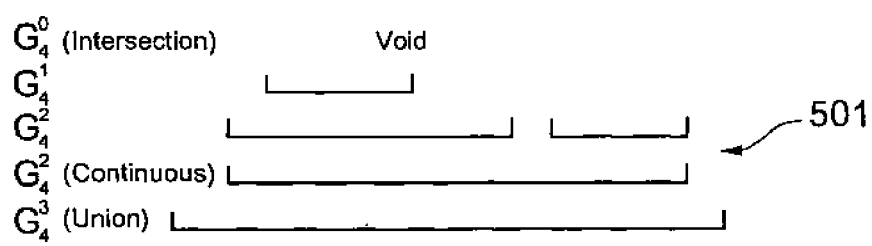

FIG. 5 shows intervals 1 to 4 for different measurements in an upper portion 500. Furthermore, FIG. 5 shows, in a lower portion 501, intervals related to different combinations of the measurements.

Improved confidence bounds (lower bounds on integrity) can be found if additional assumptions are verified.

According to one example, if the measurements are independent, integrity bounds can be (tremendously) improved.

According to another example, a repartition of integrity shortage is possible. Nothing is known about "place" of integrity shortage (that is to say that always a worst case scenario may be present). If a symmetrical distribution is present, this can be exploited.

According to a third example, knowledge about the actual pdfs can be taken into account. In other words, an assumption may be verified about the actual pdf underlying the measurement errors. So far no optimization has been made with respect to accuracy. The knowledge of the pdfs could allow to (optimally) tune the interval combination and/or the "working point" (I, $\alpha$) of the various sensors.

A further and important extension of basic principles of the invention will be explained in the following, referring to FIG. 6.

So far, the estimation of a single variable at a single moment has been described.

Figure 6:
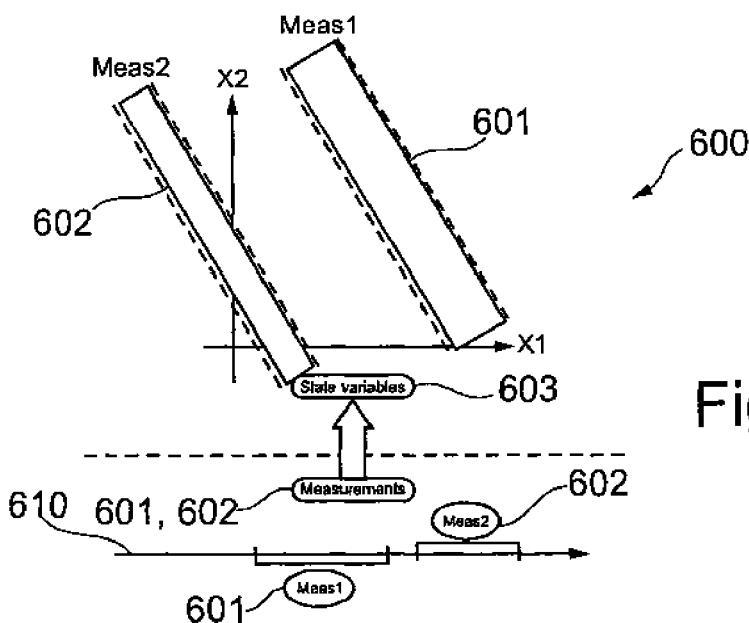
FIG. 6 illustrates a sensor measurement scheme carrying out several variable measurements at a single moment and inverting the one-dimensional measurements towards the multidimensional space of unknown variables.

However, as shown in a diagram 600 of FIG. 6, an extension to several variables measured at a single moment can be performed.

FIG. 6 shows a first measurement 601 and a second measurement 602. From the measurements 601, 602, information about state variables 603 may be derived. FIG. 6 further shows an axis 610 along which the observed variable is plotted, in accordance with the first and second measurements 601, 602.

Figure 7:
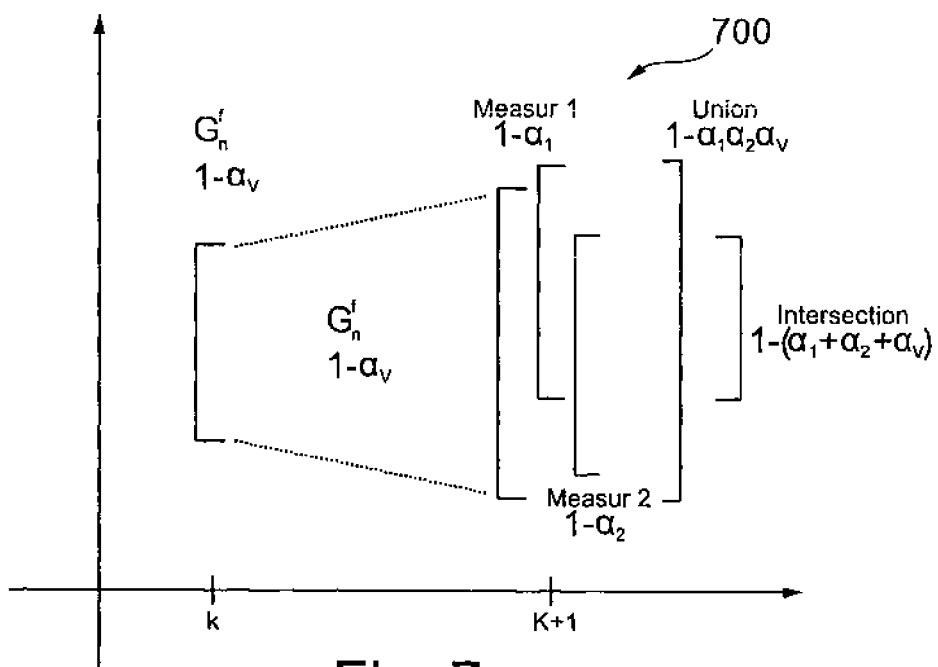
FIG. 7 illustrates an interval estimation scheme including the measurement of single or several variables at successive moments as well as the time propagation of the result of interval combinations.

In the following, referring to FIG. 7, a diagram 700 will be explained to illustrate a further extension, namely that (single or several) variables are measured at successive moments.

The diagram 700 has an abscissa 701 along which the time is plotted. Along an ordinate 702 of the diagram 700, the value of the variable is plotted. This variable is measured and estimated via the measurements. FIG. 7 shows the time propagation of an interval combination, as well as the way it can be combined at the next moment with new measurements. Again, FIG. 7 shows a plurality of different combinations of the measurements (including union, intersection, etc.).

As stated before, it is possible to extend the principle of an embodiment of the invention to an N-dimensional estimation (see FIG. 6).

In other words, a single "space" of unknown variables may be implemented. It is possible to "invert" measurements towards this space. It is further possible to provide zones (regions) instead of intervals. Principles of zone combination and integrity proof may remain the same.

A dynamic approach will be explained in the following (see FIG. 7).

In such a dynamic approach, the time evolution of variables (measurements or estimates) can be taken into account. This may include the implementation of at least one of the following two elements: Firstly, the time evolution model for some variables, and secondly, an uncertainty about this evolution (process noise).

With such a dynamic approach, time propagation may be easy if the uncertainty is modelled as a couple (interval, integrity): The further procedure may be the same as in intersection of intervals. The time dependence of the measurement errors may be added. Principles of interval combination and integrity proof may remain the same. However, much more information sources may be present (this may require some trade-offs).

Furthermore, fault detection and isolation (FDI) can be taken into account. This may be required in practice to handle long-lasting sensor faults. Such faults can be included in the (interval, confidence) model, detected (FDI) and removed, or detected (FDI) and recognized, with further adaptation of the (interval, confidence) couple.

In the following, referring to FIG. 8, and similarly to the principles sketches in FIG. 6, a diagram 1000 will be explained illustrating again an example for a sensor configuration designed in accordance with an embodiment of the invention.

The diagram 1000 has an abscissa 1001 along which a one-dimensional position, for instance of a known track along which a train is moving, is plotted. Along an ordinate 1002, the clock shift of the GPS receiver is plotted. FIG. 8 illustrates the time delay measured for a first satellite 1003, a second satellite 1004, a third satellite 1005 and a fourth satellite 1006. The trajectories plotted in FIG. 10 delimits in which regions the individual satellites provide correct or a wrong result. Intervals 1007 are the result of region combinations strategies, for which either four, three or two satellites provide the correct result.

Therefore, it is again possible to derive estimates on the basis of measurements.

Figure 8:
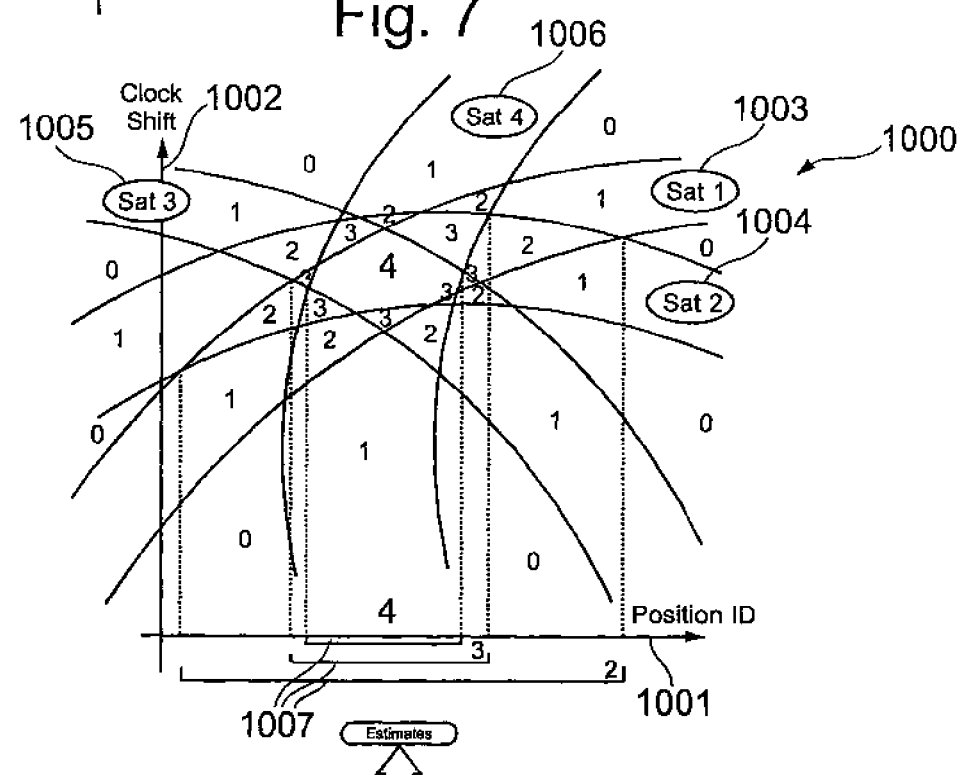
FIG. 8 illustrates a method for determining in safety the position along a known track using a plurality of GPS satellite measurements.

FIG. 8 further plots a time axis 1010 illustrating a time delay.

Therefore, safe 1D positioning with the GPS data may be made possible according to the described embodiment. It is possible to simultaneously estimate position and receiver clock shift via the satellite-related measurements 1003 to 1006. This principle can also be extended towards two-dimensional or three-dimensional position detection (without map). It can also be applied to other parameters, like speed. Any number of satellites may be implemented here, for instance two, three, four, five, six or more satellites. Extensions for three-dimensional position detection, speed detection, or a combined detection are possible.

Therefore, a general theory of confidence interval estimation (plus proof) has been given. More particularly, the number of sensors plus the individual confidence may be defined, sensor combination techniques may be applied, the number of estimated variables may be adjusted, sensor dependence may be taken into account. and a technique for safe GNSS positioning is disclosed.

Sensor sets may also be included in embodiments of the invention. Other beacons than satellites are possible, such as GSM antennas. Different coordinate systems may be used. Any transport mode may be used. Other applications are possible (state estimation). Systems like EGNOS/GALILEO may be also used as sensor arrangement for controlling an automated system.

FIG. 9 illustrates the link between the true value and the measurements.

Figure 9A:
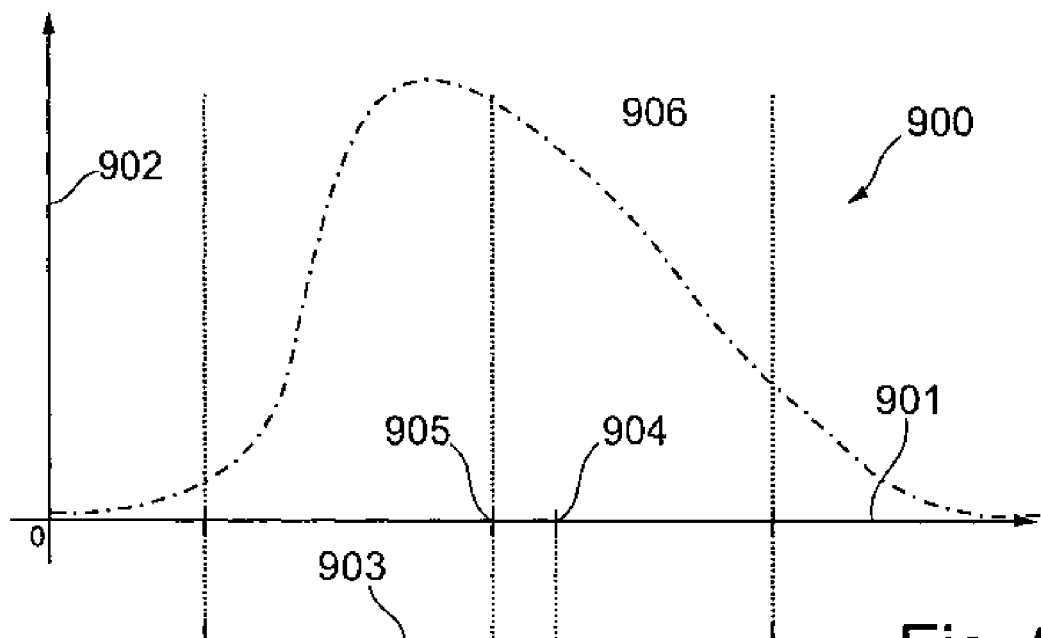
FIG. 9A illustrates a probability density function for sensor measurements given a true value.

FIG. 9A illustrates a probability density function for sensor measurements given a true value.

In more detail, FIG. 9A illustrates the diagram 900 showing a probability density function (pdf) (plotted along an ordinate 902 of the diagram 900) of the possible measurements plotted along an abscissa 901 of the diagram 900. An actual measurement is denoted with reference numeral 904, while the given true value is denoted with reference numeral 905. Reference numeral 906 indicates a probability density function of the measurements given the true value. Further, a chosen confidence interval location 903 is shown.

Figure 9B:
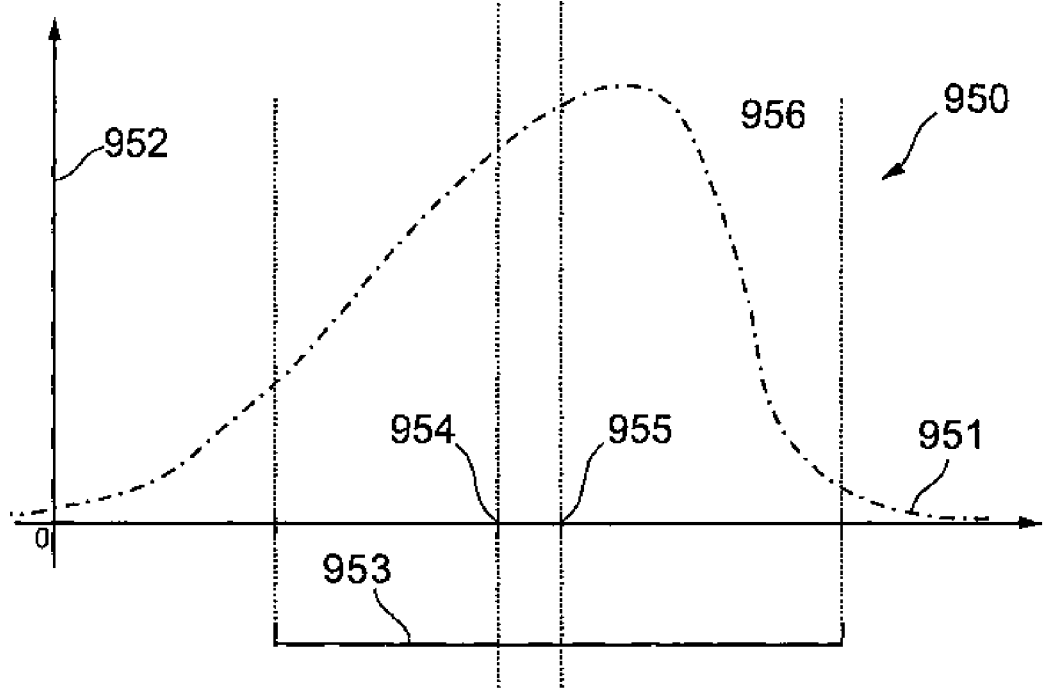
FIG. 9B illustrates a diagram showing a probability density function for true values given a measurement.

FIG. 9B illustrates a diagram showing a probability density function for true values given a measurement.

In more detail, FIG. 9B illustrates the diagram 950 showing a probability density function (plotted along an ordinate 952 of the diagram 900) of the possible true values plotted along an abscissa 951 of the diagram 950. An actual true value, that can be traced back in diagram 900, is denoted with reference numeral 954, and an actual measurement is denoted with reference numeral 955 and can be traced back in diagram 900 as well. Reference numeral 956 indicates a probability density function of the true values given the measurement. Further, a computed confidence interval 953 is shown.

FIG. 9A, FIG. 9B illustrate the relationship existing between the true value of a measured variable and its measurements. As no physical measurement is perfect, a measurement error exists, and given the true value of the variable the measurements follow a distribution characterized by a probability density function. Knowledge of this distribution allows determining one or several associations between a confidence interval and its confidence level (or at least a lower bound on its confidence). The confidence level indicates the confidence that the measurement be in the confidence interval.

Once a measurement is actually performed, with a value drawn from that pdf, it is possible to look for a confidence interval with its confidence level; the confidence level here indicates the confidence that the true value be in the confidence interval, given the performed measurement. This confidence interval can be computed by flipping the previously mentioned confidence interval, as the distribution of the true value given the measurement can simply be obtained by flipping the distribution of the measurement given the true value.

It should be noted that the term "comprising" does not exclude other elements or steps and the "a" or "an" does not exclude a plurality. Also elements described in association with different embodiments may be combined.

It should also be noted that reference signs in the claims shall not be construed as limiting the scope of the claims.

Implementation of the invention is not limited to the preferred embodiments shown in the figures and described above. Instead, a multiplicity of variants are possible which use the solutions shown and the principle according to the invention even in the case of fundamentally different embodiments.

In this application, the following references are cited:

[1] CENELEC Standard EN 50126, Railway applications—The specification and demonstration of Reliability, Availability, Maintainability and Safety (RAMS), 1999.

[2] International Electrotechnical Commission, International Standard IEC61508, Functional safety of electrical/electronic/programmable electronic safety related systems, 2000.

[3] Y. Bar-Shalom, X. -Rong Li and T. Kirubarajan, Estimation with Applications to Tracking and Navigation (Theory, Algorithms and Software), John Wiley & Sons, 2001.

[4] D. Sornette and K. Ide, The Kalman-Levy filter, Physica D, 151:142-174, 2001.

[5] M. S. Arulampalam, S. Maskell, N. Gordon and T. Clapp, A Tutorial on Particle Filters for Online Nonlinear/Non-Gaussian Bayesian Tracking, IEEE Transactions on Signal Processing, 50(2):174-188, February 2002.

[6] L. Jaulin, M. Kieffer, O. Didrit and E. Walter, Applied Interval Analysis, Springer-Verlag London Limited, 2001.

[7] R. E. Moore, Interval Analysis, Prentice-Hall, Inc., Englewood Cliffs, N.J., 1966.

[8] R. C. Williamson, Probabilistic Arithmetic, Ph. D. thesis, University of Queensland, 1989.

[9] A. Neumaier, Clouds, fuzzy sets and probability intervals, Reliable Computing, 10:249-272, 2004.

[10] Yunmin Zhu and Baohua Li, Optimal interval estimation fusion based on sensor interval estimates with confidence degrees, Automatica, 42:101-108, 2006.
[11] K. Marzullo, Tolerating Failures of Continuous—Valued Sensors, Technical Report TR 90-156, Cornell University, 1990.
[12] U. Schmid and K. Schossmaier. How to reconcile fault-tolerant interval intersection with the Lipschitz condition, Distributed Computing, 14(2):101-111, 2001.
[13] D. J. Berleant, S. Ferson, V. Kreinovich and W. A. Lodwick, Combining Interval and Probabilistic Uncertainty: Foundations, Algorithms, Challenges—An Overview, 4th International Symposium on Imprecise Probabilities and Their Applications, Pittsburgh, Pa., 2005.
[14] S. Ferson, J. Hajagos, D. Berleant, J. Zhang, W. T. Tucker, L. Ginzburg, and W. Oberkampf. Dependence in Dempster-Shafer theory and probability bounds analysis, Technical Report SAND2004-3072. Sandia National Laboratory, 2004.
[15] A. Simsky, F. Wilms and J. -P. Franckart, GNSS based failsafe train positioning system for low-density traffic lines based on one-dimensional positioning algorithm, ESA NAVITEC Workshop, 2004.
[16] EP1299746
[17] EP0881136
[18] EP0825418
[19] DE 19722907
[20] U.S. Pat. No. 5,893,043
[21] WO01/42621
[22] U.S. Pat. No. 6,445,728
[23] WO02/03094
[24] US2003/018618
[25] EP1462761
[26] US2004/172401
[27] DE10338234
[28] WO05/09517
[29] M. Jaeger, Automatic Derivation of Probabilistic Inference Rules, Int. J. of Approximate Reasoning, 28(1):1-22, 2001.
[30] T. Hailperin. Boole's logic and probability, volume 85 of Studies in Logic and Computation. North-Holland Publishing Co., Amsterdam, The Netherlands, 1976.
[31] T. Hailperin. Probability logic. Notre Dame Journal of Formal Logic, 25(3):198-212, 1984.

The invention claimed is:

1. A system for designing a sensor arrangement for an automated system, the system comprising
a configuration unit having a processor;
a first input unit coupled to the configuration unit for receiving a specification of a plurality of sensor measurements to be carried out by the sensor arrangement;
wherein the sensor measurements are indicative of a measurement of a parameter sensed by one or a plurality of sensors of the sensor arrangement;
wherein the parameter is adapted for monitoring or controlling the automated system;
a second input unit coupled to the configuration unit for receiving a specification of a confidence region together with an associated confidence level for each of the specified sensor measurements;
wherein the confidence region is indicative of an interval for a plausible physical value of the parameter;
wherein the confidence level is indicative of a probability that the value of a sensed parameter detected by a respective sensor measurement deviates from a true value of the sensed parameter by less than a value indicated by the confidence region; and
a third input unit coupled to the configuration unit for receiving a specification of a target confidence level for the automated system;
wherein the target confidence level is indicative of a probability that the automated system fails; and
wherein the configuration unit for configuring the plurality of sensor measurements and for configuring the combination of the sensor measurements in a manner to guarantee the target confidence level for the automated system generates a representation of a sensor arrangement.

2. The system according to claim 1, wherein the first input unit is adapted for receiving a specification of the plurality of sensors each adapted to perform at least one of the sensor measurements.

3. The system according to claim 1, wherein the first input unit is adapted for receiving a specification of exactly one sensor adapted to perform the plurality of sensor measurements.

4. The system according to claim 1, wherein the first input unit is adapted for receiving a specification of a plurality of sensor measurements to be carried out to detect at least one sensed parameter indicative of an operation state or an operation parameter of the automated system.

5. The system according to claim 1, wherein the second input unit is adapted for receiving the specification of the confidence region together with a lower bound on the confidence level associated to the confidence region.

6. The system according to claim 1, wherein the configuration unit is adapted for configuring the plurality of sensor measurements based on an evaluation whether and/or to which degree the plurality of sensor measurements are dependent or independent from one another.

7. The system according to claim 1, wherein the configuration unit is adapted for determining, based on the confidence levels, a number of sensor measurements necessary to guarantee the target confidence level.

8. The system according to claim 1, wherein the configuration unit is adapted for determining a chronology, particularly a time sequence or an acquisition rate, of the sensor measurements to guarantee the target confidence level.

9. The system according to claim 1, wherein the configuration unit is adapted for adjusting at least one working point of at least one sensor adapted for carrying out at least one of the sensor measurements.

10. The system according to claim 1, wherein the configuration unit is adapted for adjusting a combination technique of combining the results of the plurality of sensor measurements to guarantee the target confidence level.

11. The system according to claim 10, wherein the combination technique is indicative of a way of combining the plurality of sensor measurements and/or the confidence levels comprising at least one of the group consisting of calculating a union, an intersection, a K-in combination, and a K-best combination.

12. The system according to claim 1, wherein the configuration unit is adapted for reconfiguring the plurality of sensor measurements when a determined configuration of the plurality of sensor measurements yields an obtained confidence level which guarantees a safety of the automated system better than the specified target confidence level, wherein the reconfiguration is performed to obtain one or a plurality of the group consisting of an improved accuracy, a simpler sensor arrangement, and an obtained confidence level which is closer to the specified target confidence level.

13. The system according to claim 1, wherein the second input unit is adapted for receiving the specification of a confidence interval as the confidence region in a one-dimensional scenario.

14. The system according to claim 1, adapted for designing the sensor arrangement to provide at least one of the group consisting of control information for controlling an operation of the automated system, regulation information for regulating an operation of the automated system, and monitoring information for monitoring an operation of the automated system.

15. The system according to claim 1, comprising a determining unit adapted for determining the confidence level and the confidence region for at least a part of the specified sensor measurements based on a respective preknown sensor characteristic and is adapted to supply the confidence level and the confidence region to the second input unit.

16. The system according to claim 1, adapted for designing a sensor arrangement for an automated system comprising at least one of the group consisting of an emergency shut-down system, a fire and gas system, a turbine control system, a gas burner management system, a crane automatic safe-load indicator system, a guard interlocking and emergency stopping system for machinery, a medical device, a dynamic positioning system, a fly-by-wire operation of aircraft flight control surfaces system, a railway signaling system, a variable speed motor drive system, an automobile indicator lights system, an anti-lock braking and engine-management system, a remote monitoring system, an operation or programming system for a network-enabled process plant, an anti-collision traffic system, a nuclear plant, a chemical factory, a train, and an aircraft.

17. A method of designing a sensor arrangement for an automated system, the method comprising
    receiving a specification of a plurality of sensor measurements to be carried out by the sensor arrangement at a first input of a configuration unit;
    wherein the sensor measurements are indicative of a measurement of a parameter sensed by one or a plurality of sensors of the sensor arrangement;
    wherein the parameter is adapted for monitoring or controlling the automated system;
    receiving a specification of a confidence region together with an associated confidence level for each of the specified sensor measurements at a second input of the configuration unit;
    wherein the confidence region is indicative of an interval for a plausible physical value of the parameter;
    wherein the confidence level is indicative of a probability that the value of a sensed parameter detected by a respective sensor measurement deviates from a true value of the sensed parameter by less than a value indicated by the confidence region;
    receiving a specification of a target confidence level for the automated system at a third input of the configuration unit;
    wherein the target confidence level is indicative of a probability that the automated system fails; and
    using the configuration unit to configure the plurality of sensor measurements and for configuring the combination of the sensor measurements in a manner to guarantee the target confidence level for the automated system.

18. The method of claim 17, further comprising:
generating a representation of a sensor arrangement.

* * * * *

UNITED STATES PATENT AND TRADEMARK OFFICE
CERTIFICATE OF CORRECTION

PATENT NO. : 8,326,784 B2
APPLICATION NO. : 12/094518
DATED : December 4, 2012
INVENTOR(S) : Francois Meers et al.

Page 1 of 1

It is certified that error appears in the above-identified patent and that said Letters Patent is hereby corrected as shown below:

Column 15, line 62, delete " $X_{f+1}{}^n$ " and insert -- $X^n_{f+1}$ --.

Signed and Sealed this
Fifth Day of February, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,326,784 B2
APPLICATION NO. : 12/094518
DATED : December 4, 2012
INVENTOR(S) : Francois Meers et al.

It is certified that error appears in the above-identified patent and that said Letters Patent is hereby corrected as shown below:

Title Page, at (73) Assignee: after "Multitel ASBL, Mons (BE)" insert -- Faculte Polytechnique de Mons, Mons (BE) --

Signed and Sealed this
Twenty-fifth Day of June, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,326,784 B2
APPLICATION NO. : 12/094518
DATED : December 4, 2012
INVENTOR(S) : Francois Meers et al.

It is certified that error appears in the above-identified patent and that said Letters Patent is hereby corrected as shown below:

In the Specification

At Col. 15, line 24, delete that portion of equation (3) to the left of the equal sign ("=") and insert -- $P(x_1 \wedge x_2)$ --.

Signed and Sealed this
Thirteenth Day of August, 2013

Teresa Stanek Rea
*Acting Director of the United States Patent and Trademark Office*